United States Patent [19]
Tomatsu et al.

[11] Patent Number: 5,279,128
[45] Date of Patent: Jan. 18, 1994

[54] DEHUMIDIFYING APPARATUS WITH ELECTRONIC REFRIGERATION UNIT

[75] Inventors: Yoshitaka Tomatsu, Nagoya; Kenji Yamada, Chiryu; Tatsuya Oike, Okazaki; Kazutoshi Nishizawa, Toyoake; Satoshi Itou, Kariya, all of Japan

[73] Assignee: Nippondenso Co., Ltd., Kariya, Japan

[21] Appl. No.: 784,231

[22] Filed: Oct. 30, 1991

[30] Foreign Application Priority Data

Oct. 30, 1990 [JP] Japan ................. 2-290836
Jun. 4, 1991 [JP] Japan ................. 3-132868
Sep. 20, 1991 [JP] Japan ................. 3-241464

[51] Int. Cl.$^5$ .................................. F25B 21/02
[52] U.S. Cl. ............................. 62/3.4; 62/3.2
[58] Field of Search ............... 62/3.2, 3.4, 3.6, 3.62

[56] References Cited

U.S. PATENT DOCUMENTS

| Re. 26,612 | 6/1969 | Mole ................... 62/3.4 |
| 4,326,383 | 4/1982 | Reed et al. ........... 62/3.62 |
| 5,038,569 | 8/1991 | Shirota et al. ......... 62/3.2 |

FOREIGN PATENT DOCUMENTS 60-41525 3/1985 Japan .
60-41528 3/1985 Japan .
60-44021 3/1985 Japan .

*Primary Examiner*—John M. Sollecito
*Attorney, Agent, or Firm*—Cushman, Darby & Cushman

[57] ABSTRACT

A dehumidifying apparatus with an electronic refrigeration unit includes a thermoelectric unit, a DC power source, and absorbing and liberating heat exchangers. The thermoelectric unit includes a plurality of N-type thermoelectric elements, heat absorbing electrodes, P-type thermoelectric elements, and heat liberating electrodes electrically connected in series. The DC power source supplies DC current to the N-type and P-type thermoelectric elements serially connected through the heat absorbing and heat liberating electrodes. The absorbing and liberating heat exchanger are integrated with the heat absorbing and liberating electrodes, respectively. A heat liberating surface of the liberating heat exchanger is formed at a position different from the absorbing heat exchanger. The absorbing and liberating heat exchangers include heat absorbing and liberating fins, respectively. A notch is formed in one side of each of the heat liberating fins so that a part of a heat absorbing fin fits the notch. The heat absorbing fins are set in a position corresponding to a notch of a corresponding heat liberating fin so that a part of the heat absorbing fin overlaps a part of the heat liberating fin. The overlapped portions are used for the heat absorbing and heat liberating electrodes.

24 Claims, 25 Drawing Sheets

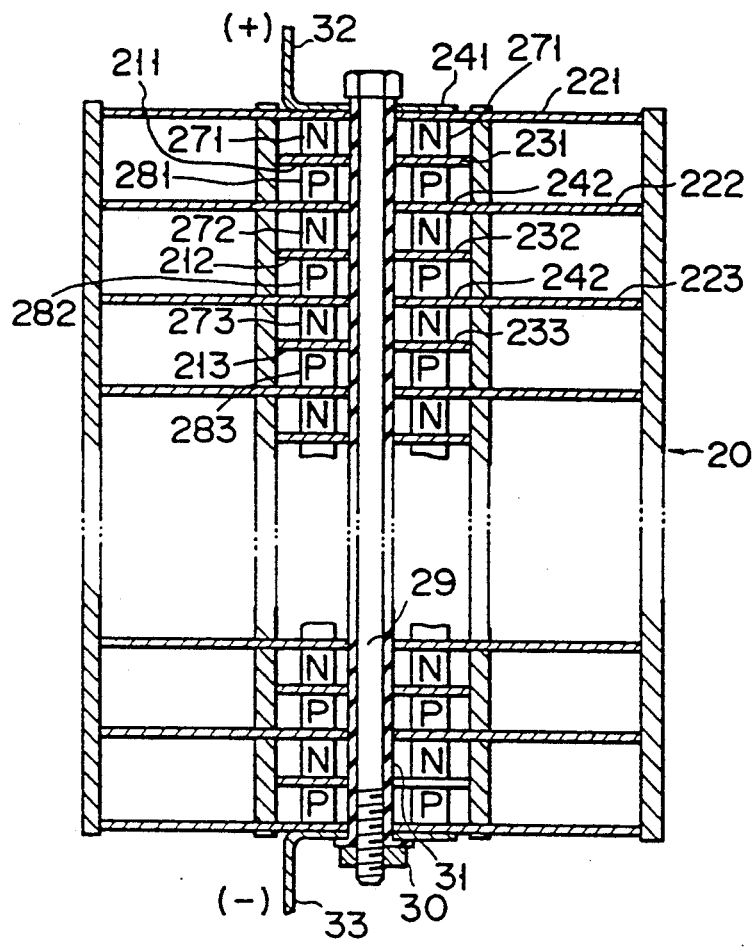
F I G. 4

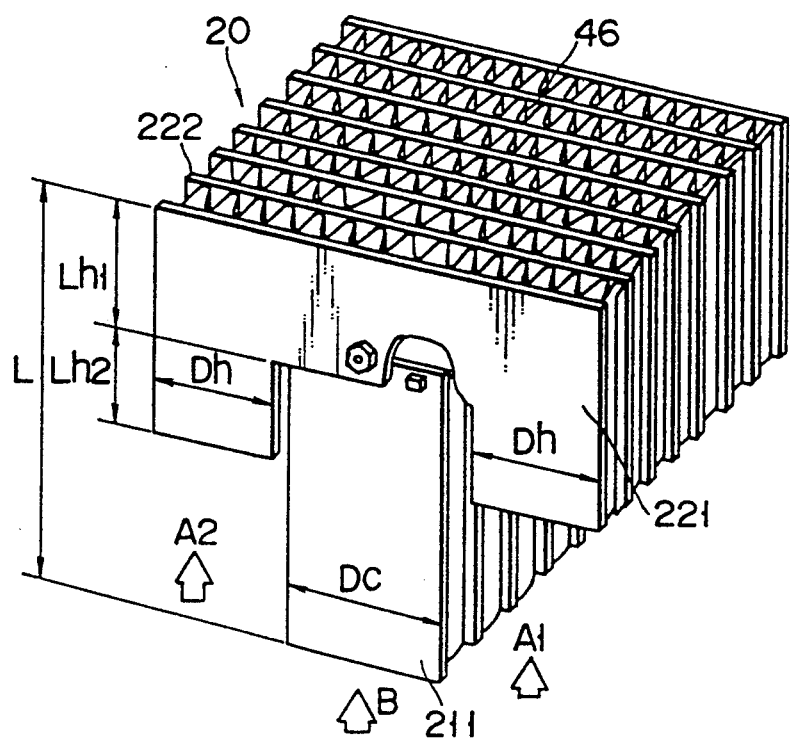
F I G. 10
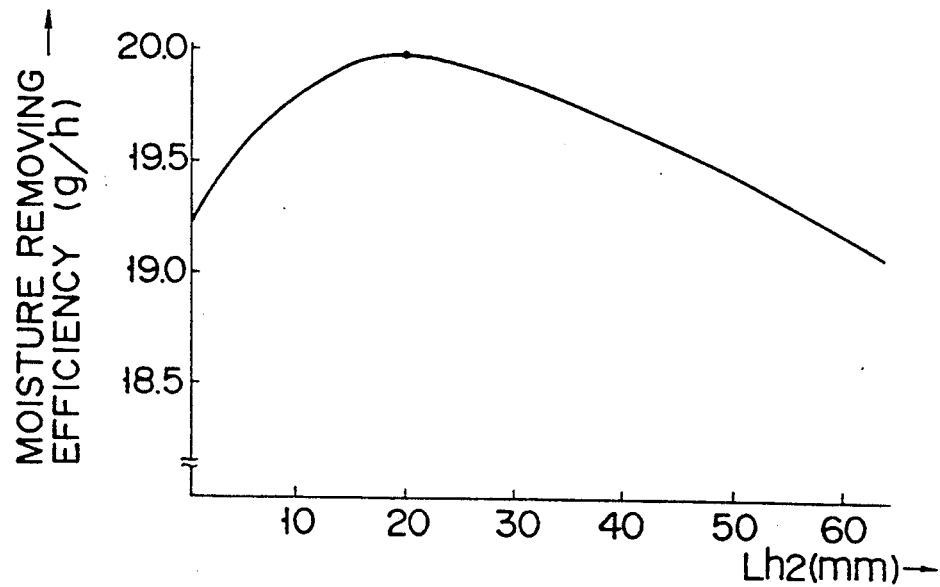
F I G. 11

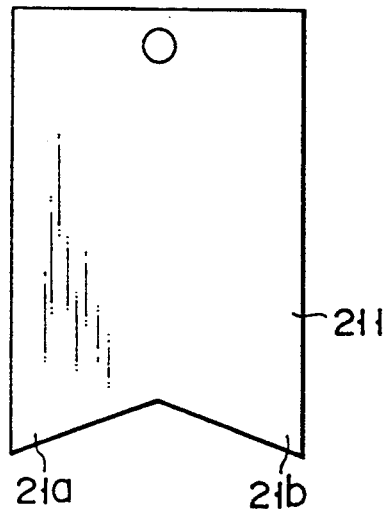
F I G. 13A
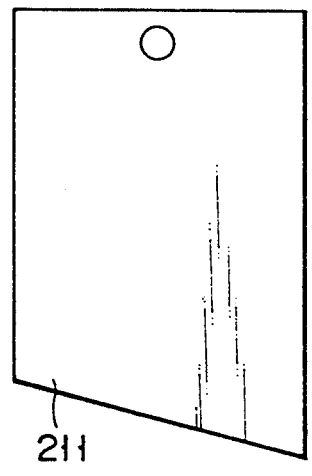   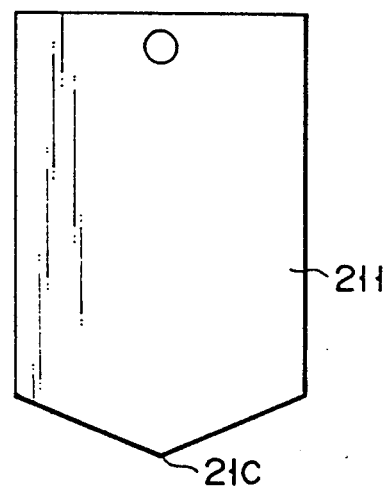
F I G. 13B    F I G. 13C

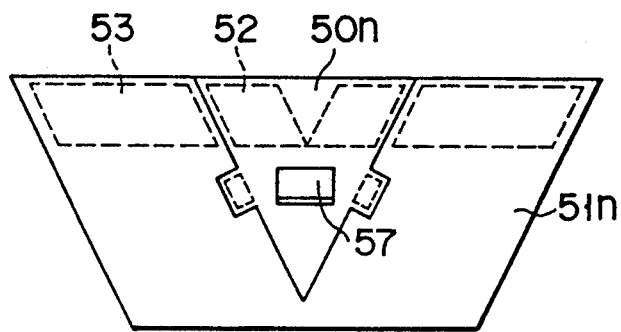
F I G. 17
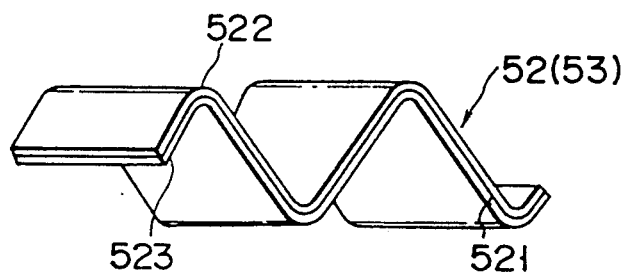
F I G. 18

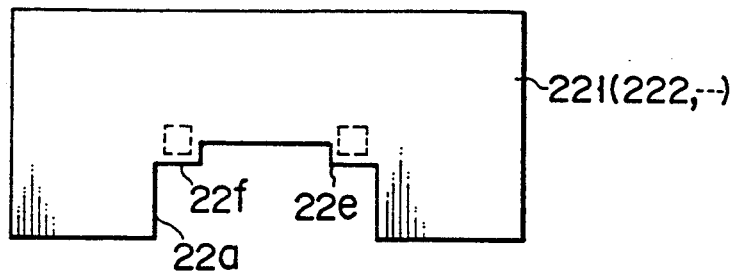
F I G. 26A
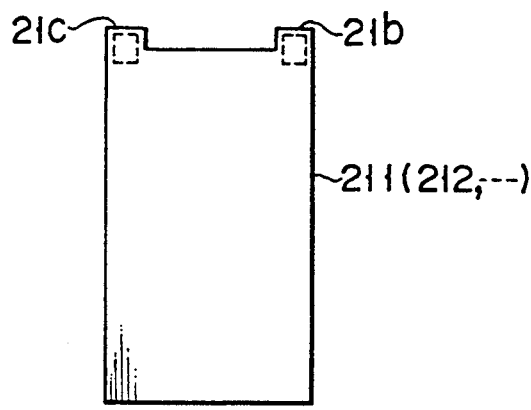
F I G. 26B
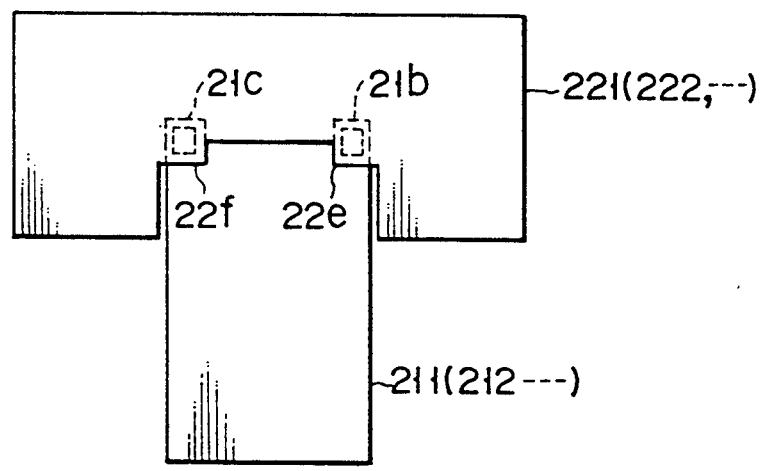
F I G. 26C

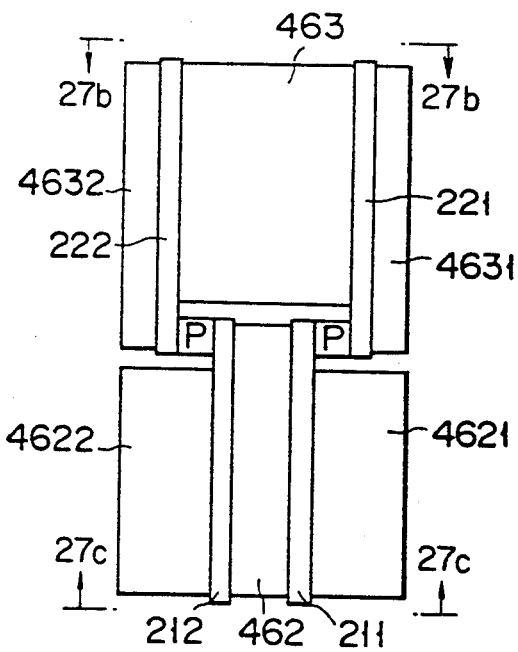
F I G. 27A
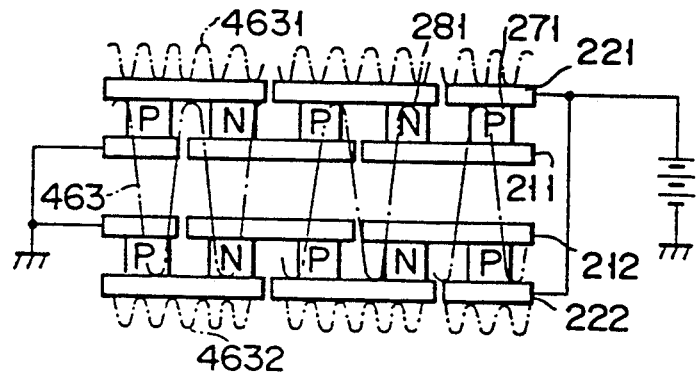
F I G. 27B
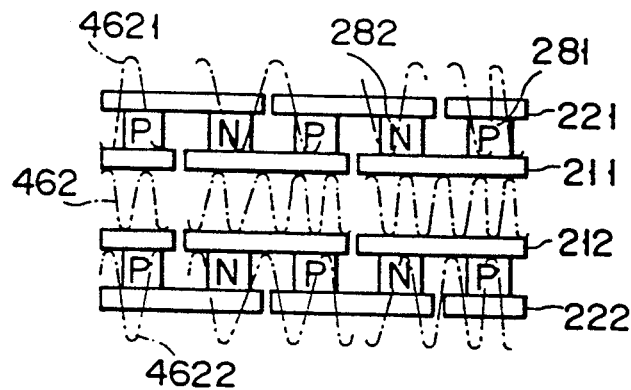
F I G. 27C

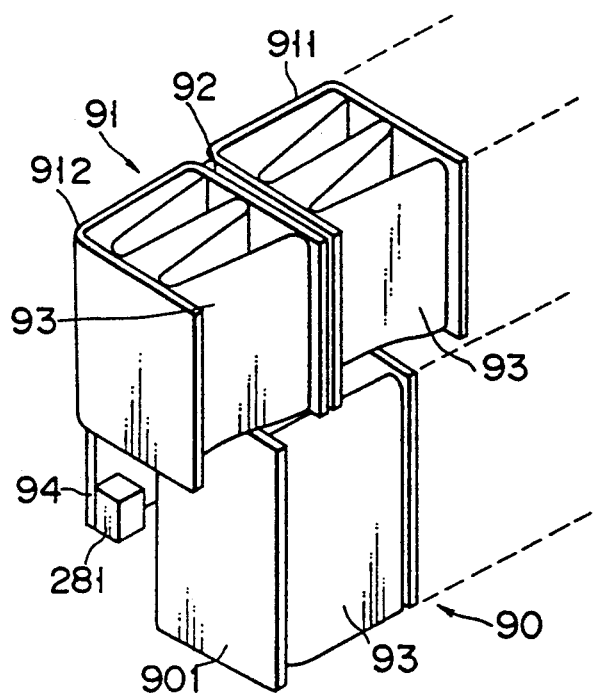
F I G. 29A
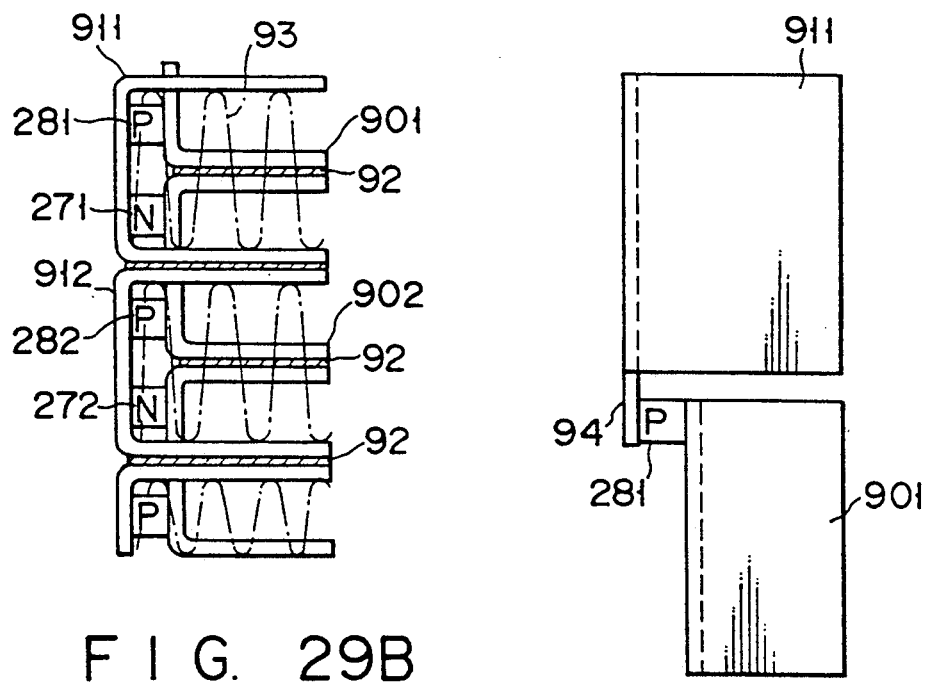
F I G. 29B
F I G. 29C

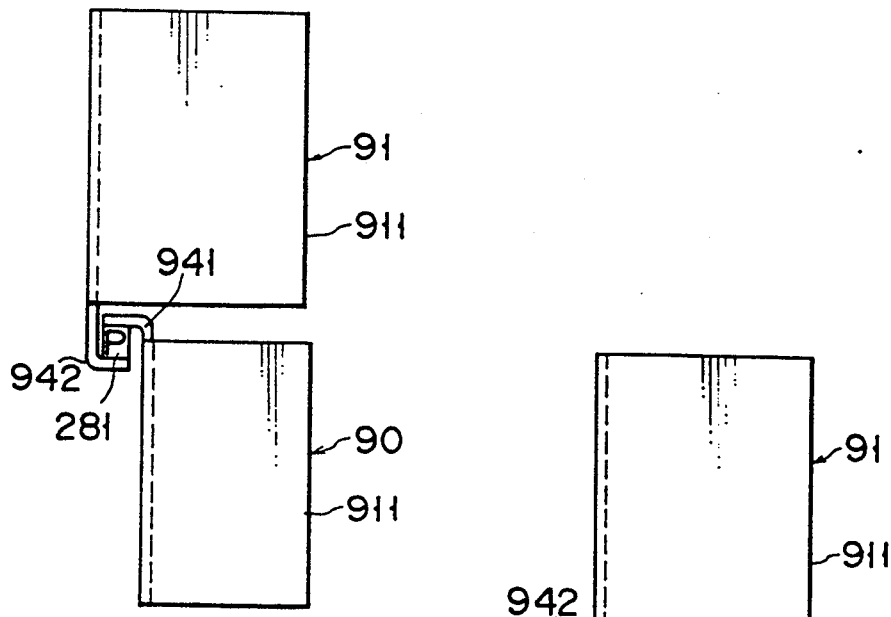
FIG. 32A
FIG. 32B
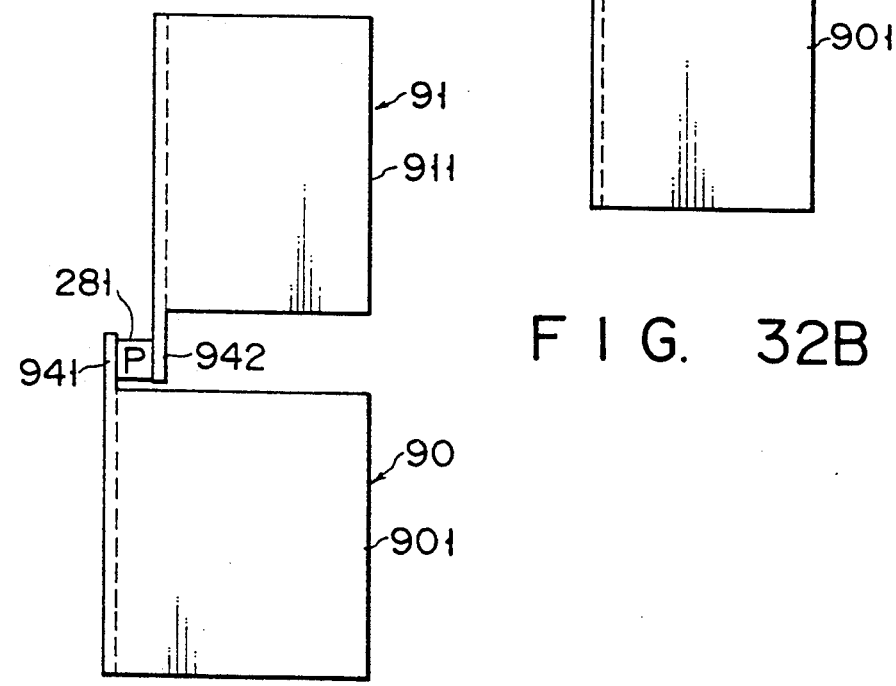
FIG. 32C

DEHUMIDIFYING APPARATUS WITH ELECTRONIC REFRIGERATION UNIT

BACKGROUND OF THE INVENTION

1. Field of the Invention

The present invention relates to a dehumidifying apparatus with an electronic refrigeration unit utilizing heat-absorbing-type and heat liberating-type reactions based on Peltier effect produced at the junction between an N-type thermoelectric element consisting of N-type semiconductor and a P-type thermoelectric element consisting of P-type semiconductor.

2. Description of the Related Art

It is considered to form a dehumidifying apparatus with a thermoelectric conversion unit consisting of N-and P-type thermoelectric elements. FIG. 34 shows a thermoelectric conversion unit to be applied to the above dehumidifying apparatus, having a plurality of N-type thermoelectric elements 111, 112, ... consisting of N-type semiconductor and P-type thermoelectric elements 121, 122, ... consisting of P-type semiconductor which are linearly arranged by turns at a certain interval. These arranged N-type thermoelectric elements 111, 112, ... and P-type thermoelectric elements 121, 122, ... are successively connected at their top and bottom in series by heat-absorbing-type electrodes 131, 132, ... and heat-liberating-type electrodes 141, 142, ...

That is, when a DC power source is connected to a group of the serially-connected thermoelectric conversion elements, heat absorbing reaction occurs at the heat-absorbing-type electrodes 131, 132, ... constituting the NP junction and heat liberating reaction occurs at the heat-liberating-type electrodes 141, 142, ... constituting the PN junction, in the current flowing direction because of Peltier effect.

Insulating plates 15 and 16 are installed so that they are faced each other on the surfaces where the heat-absorbing-type electrodes 131, 132, ... and heat-liberating-type electrodes 141, 142, ... are set, in order to hold the groups of thermoelectric conversion elements. And, an absorbing heat exchanger 17 and liberating heat exchanger 18 are installed outside the insulating plates 15 and 16 so that the exchangers are faced each other.

For the thermoelectric conversion unit with the above structure, the temperature decreases at the heat-absorbing-type electrodes 131, 132, ... and the low temperature is transmitted to the absorbing heat exchanger 17 through the insulating plate 15, while the temperature rises at the heat liberating-type elements 141, 142, ... and the high temperature is transmitted to the liberating heat exchanger 18 through the insulating plate 16. Therefore, heat absorbing and heat liberating effects are always taken out through the insulating plates 15 and 16 and the absorbing and liberating efficiencies are greatly decreased by the insulating plates 15 and 16.

For a dehumidifying apparatus consisting of the above thermoelectric unit, the air dehumidified and cooled by the absorbing heat exchanger 17 is sent to the liberating heat exchanger 18 to be heated. Therefore, the size of an heat liberating fin installed on the liberating heat exchanger 18 increases. In this case, because the insulating plate 16 is set between the heat-liberating-type electrodes 141, 142, ... producing liberating effect and the liberating heat exchanger 18, the thermoelectric conversion effect decreases. Therefore, to obtain adequate dehumidifying effect, the size of the thermoelectric conversion unit must be increased.

SUMMARY OF THE INVENTION

It is an object of the present invention to provide a compact dehumidifying apparatus for improving the dehumidifying effect by further improving the thermoelectric conversion effect of a thermoelectric conversion unit constituting an electronic refrigerator and effectively using the air dehumidified and cooled by an absorbing heat exchanger to release heat.

It is another object of the present invention to provide a dehumidifying apparatus for improving the dehumidifying effect by more efficiently transmitting the heat produced by the heat absorbing or heat liberating reaction generated at the junction between the N-type thermoelectric element and P-type thermoelectric element to the heat absorbing and heat liberating fins to execute effective thermoelectric conversion.

It is still another object of the present invention to provide a dehumidifying apparatus comprising a plurality of N-type and P-type thermoelectric elements and heat absorbing and heat liberating fins, in which a channel of the dehumidified air is formed so that the air smoothly flows and the assembly has an adequate mechanical strength.

For the dehumidifying apparatus related to the present invention, a plurality of N-type and P-type thermoelectric elements are alternately arranged and connected in series through each electrode to form a thermoelectric conversion unit, absorbing and liberating heat exchangers are installed at the electrode section so that heat can be transmitted and a heat absorbing surface is formed in different surfaces, and an air channel is formed in the direction from the absorbing heat exchanger to the liberating heat exchanger.

For the dehumidifying apparatus with the above structure, absorbing reaction occurs due to Peltier effect at the electrode section where the absorbing heat exchanger is installed by connecting a DC power supply to the thermoelectric conversion unit and liberating reaction occurs at the electrode section where the liberating heat exchanger is installed. The air cooled and dehumidified by the absorbing heat exchanger is supplied to the liberating heat exchanger to cool the liberating heat exchanger and outputted as dehumidified air. In this case, the electrode section alternately connecting N-type and P-type thermoelectric elements in series alternately functions as a low- or high-temperature section and the temperature is directly transmitted to the absorbing and liberating heat exchangers. Therefore, the air cooling efficiency and the cooling effect of the heat liberating section are greatly improved. Thus, efficient dehumidification is executed by a compact structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4 through 6 show sectional block diagrams corresponding to the sections 4—4, 5—5, and 6—6 of FIG. 3;

FIG. 10 shows a schematic for explaining the structural conditions of the dehumidifying apparatus described in the embodiment;

FIG. 11 is a diagram showing the change state of dehumidification amount related to the conditions shown in FIG. 10;

FIGS. 13A through 13C show various shapes of the heat absorbing fin;

FIG. 17 shows a front view of the dehumidifying apparatus related to the fifth embodiment;

FIG. 18 shows a part of the corrugated fin used for the fifth embodiment;

FIGS. 26A through 26C show schematics of the eleventh embodiment of the present invention. FIGS. 26A and 26B show heat absorbing and heat liberating fins and FIG. 26C shows a schematic of assembled heat absorbing and heat liberating fins;

FIG. 27A shows a front view of the dehumidifying apparatus related to the twelfth embodiment of the present invention;

FIGS. 27B and 27C show schematics viewed from the lines 27b—27b and 27c—27c in FIG. 27A;

FIGS. 29A through 29C show a perspective, top, and side views of the fourteenth embodiment of the present invention;

FIGS. 32A through 32C show still other modifications of the fourteenth embodiment;

DETAILED DESCRIPTION OF THE PREFERRED EMBODIMENTS

Figure 1:
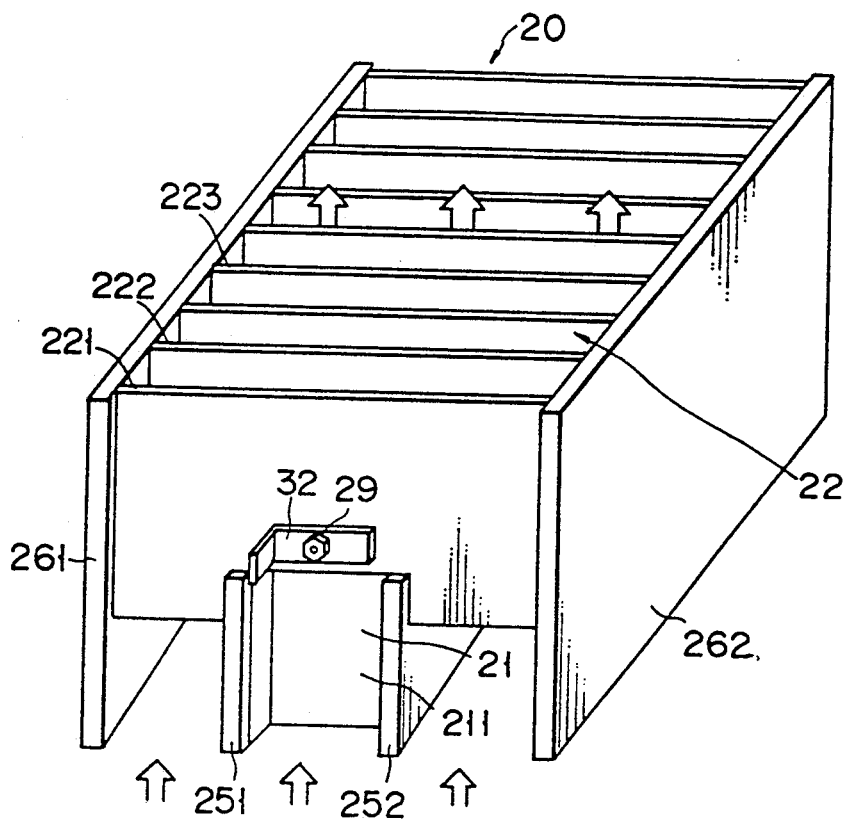
FIG. 1 shows a perspective view of the dehumidifying apparatus related to an embodiment of the present invention.

FIGS. 1 through 6 describe the structure of the dehumidifying apparatus 20 related to the first embodiment of the present invention. The dehumidifying apparatus 20, as shown in FIG. 1, has an absorbing heat exchanger 21 consisting of heat absorbing fins 211, 212, . . . and a liberating heat exchanger 22 consisting of heat liberating fins 221, 222, . . . .

Figures 2A, 2B:
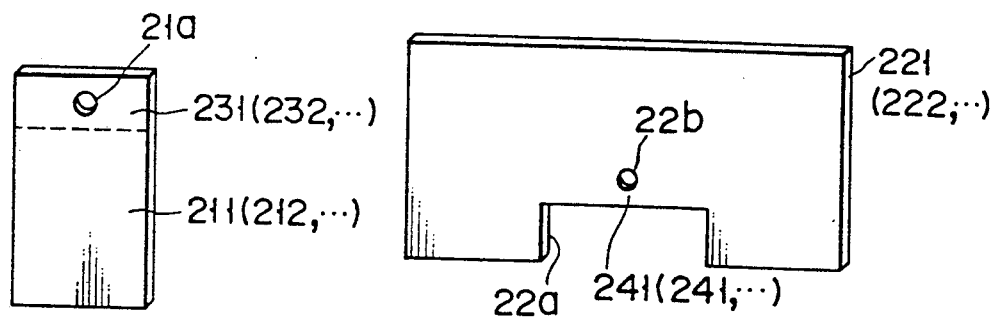
FIGS. 2A and 2B show schematics of the heat absorbing and heat liberating fins constituting the dehumidifying apparatus.

FIG. 2A shows on endothermic fin 211 constituting the absorbing heat exchanger 21. Other heat absorbing fins 212, . . . have the same structure. FIG. 2B shows one heat liberating fin 221. Other heat liberating fins 222, . . . have the same structure.

The heat absorbing fin 211 (222, . . . ) is composed of, for example, a rectangular metallic plate with electric conductivity and heat conductivity and a through-hole 21a is formed, for example, on the top shorter side of the rectangular plate. The area where the through-hole 21a is formed is used for the absorbing side electrode 231 (232, . . . ).

The heat liberating fin 221 (222, . . . ) is composed of a rectangular metallic plate with electric conductivity and heat conductivity, a notch 22a with a width slightly larger than that of the heat absorbing fin 211 is formed, for example, at the center under the fin, and liberating side electrode 241 (242, . . . ) is protruded downward from the upper side of the notch 22a.

The heat absorbing fins 211, 212, . . . and heat liberating fins 221, 222, . . . are alternately arranged in parallel. The parallely arranged heat absorbing fins 211, 212, . . . are secured by a pair of portioning guide side plates 251 and 252 installed at the both sides of the fins.

Also, the heat liberating fins 221, 222, . . . are secured at the both sides of them by the side plates 261 and 262. The upper sides of the side plates 251 and 252 of the heat absorbing fins 211, 212, . . . are fitted to the both sides of the electrode 241 at the notch 22a of the heat liberating fins 221 (222, . . . ) to assemble the absorbing heat exchanger 21 with the liberating heat exchanger 22. Then, an thermoelectric element consisting of N-type and P-type semiconductors is set to the above assembled heat exchanging system.

Figure 3:
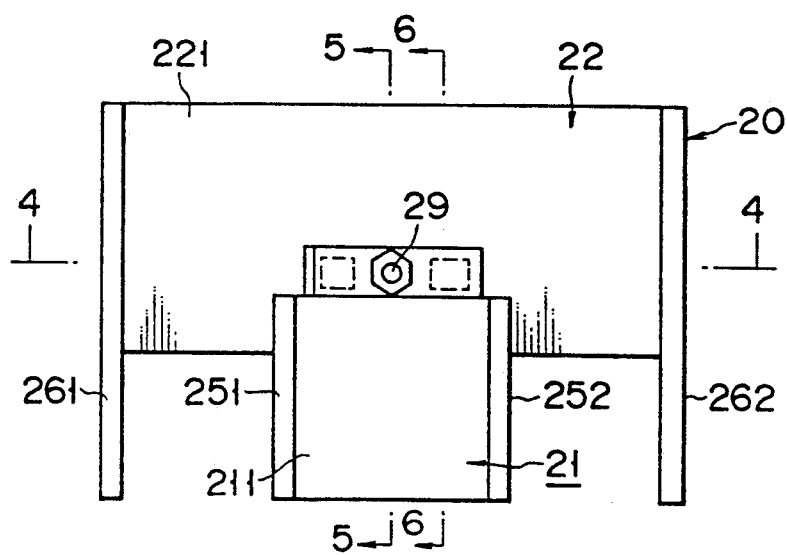
FIG. 3 shows a front view of the dehumidifying apparatus.
Figure 5:
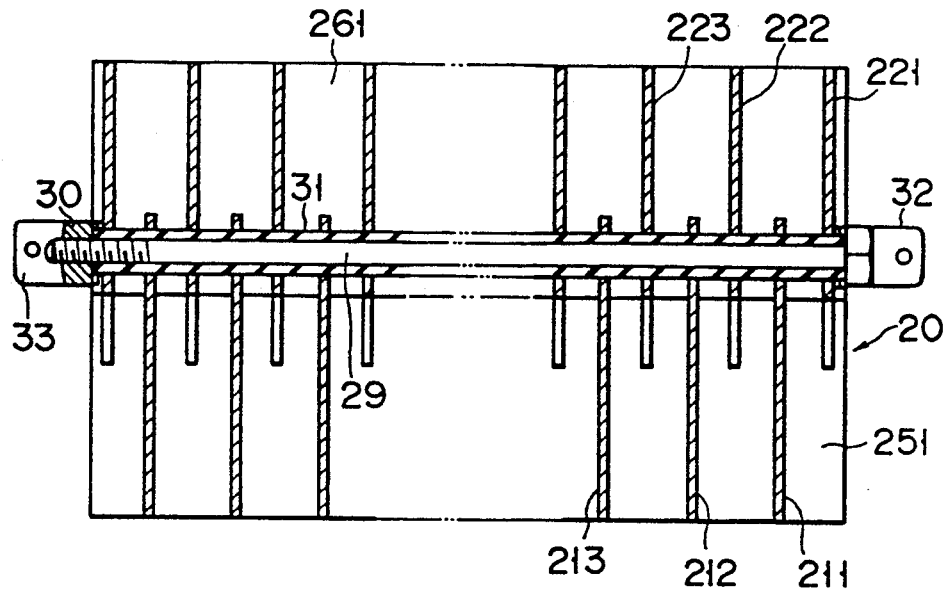
Figure 6:
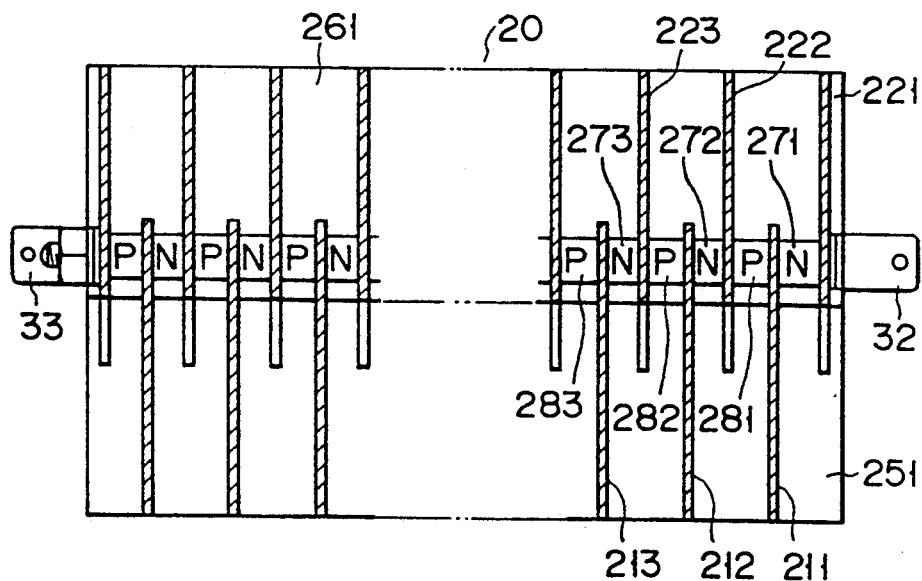

FIGS. 3 and 4 show assembled thermoelectric elements, in which, for example, two lines of N-type thermoelectric element 271 are set between the electrode 241 of the heat liberating fin 221 and the electrode 231 of the heat absorbing fin 211 and two lines of the P-type thermoelectric element 281 is set between the electrode 231 and the electrode 242 of the heat liberating fin 222. That is, the thermoelectric conversion unit for absorbing and releasing heat is formed by alternately setting N-type thermoelectric elements 271, 272, ... and P-type thermoelectric elements 281, 282, ... between electrodes so that N-type thermoelectric elements 271, 272, ... and P-type thermoelectric elements 281, 282, ... are connected in series.

In this case, each thermoelectric element and electrode are electrically and mechanically connected by a brazing filter material such as solder. Under the above combined state, a bolt 29 is inserted into the coaxial through-holes 21a and 22b formed on the heat absorbing fins 211, 212, ... and heat liberating fins 221, 222, ... to secure them with a nut 30. The bolt 29 is covered with an insulating pipe 31 to insulate the bolt from the fins so that the fins are not electrically connected each other. In FIGS. 3 and 4, numerals 32 and 33 are power terminals. The power terminal 32 is connected to the positive terminal of a DC power source (not illustrated) and the terminal 33 is connected to the negative terminal of it.

For the apparatus with the above structure, a DC power source is connected between the power terminals 32 and 33. When current flows in the direction from the N-type thermoelectric element 271 to the P-type thermoelectric element 281, the temperature of the NP junction corresponding to the electrode 231 connecting thermoelectric elements 271 and 281 is decreased due to Peltier effect and heat absorbing reaction is caused by the heat absorbing fin 211 integrated with the electrode 231. On the contrary, the temperature of the electrode 242 constituting the PN junction is increased and liberating reaction is a caused by the heat liberating fin 222.

In this case, if air flow is generated by a blower (not illustrated) from the bottom as shown by the arrow in FIG. 1, the air is led to the air channel formed by the side plates 251 and 252 and cooled through the absorbing heat exchanger 21 consisting of heat absorbing fins 211, 212, .... Then, the cooled air is sent to the liberating heat exchanger 222 consisting of the heat liberating fins 221, 222, ... In addition, externally cooled air is sent to the area enclosed by the side plates 261 and 262 outside the side plates 251 and 252.

That is, the air sent to the absorbing heat exchanger 21 is cooled and dehumidified and the cooled and dehumidified air passes through the first air channel consisting of the side plates 251 and 252 to cool the upper-side heat exchanger 22. The heat exchanger 22 is further cooled by the air sent through the second air channel consisting of the side plates 261 and 262. Then, dehumidified air is exhausted from the upper side of the liberating heat exchanger 22 and the dehumidifying apparatus 20 functions.

Figure 7:
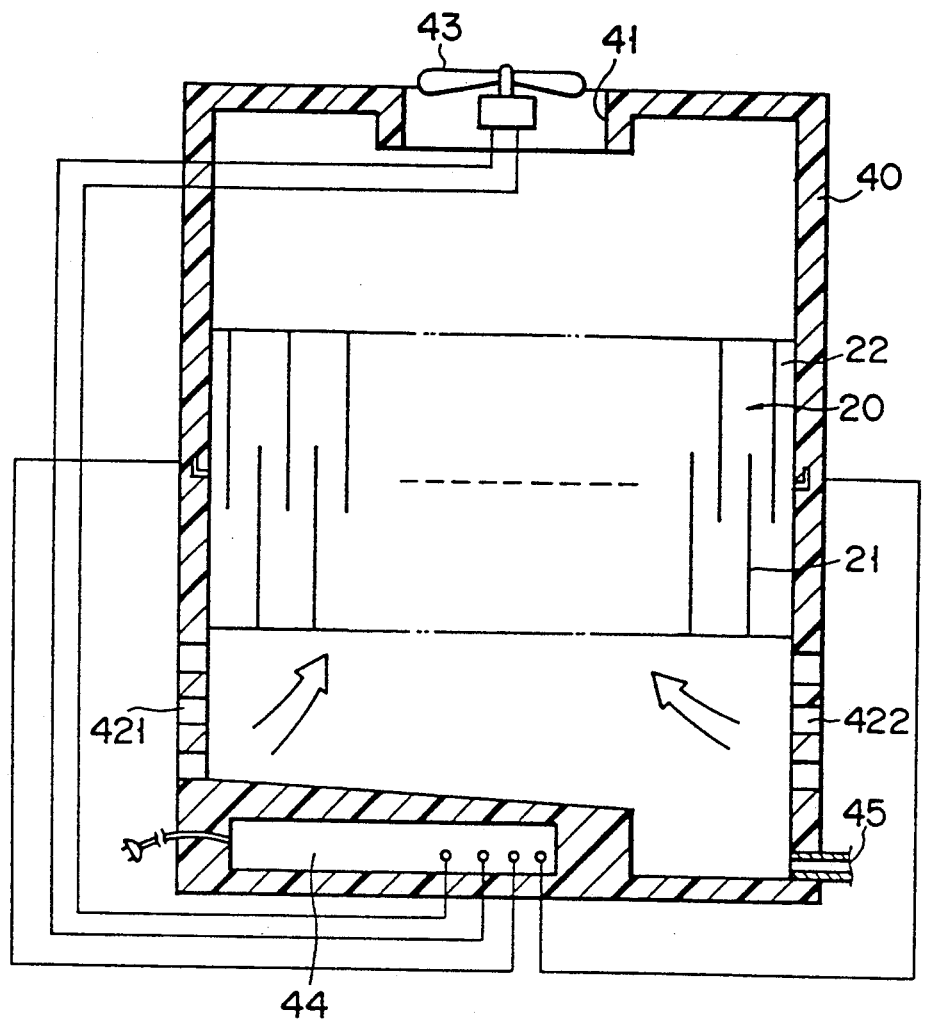
FIG. 7 shows a versatile application of the dehumidifying apparatus having the structure shown in the above embodiment.

FIG. 7 shows an actual application of the dehumidifying apparatus 20 with the above structure. The dehumidifying apparatus 20 is installed in a casing 40. An exhaust port 41 for exhausting dehumidified air is formed on the top of the casing 40 and air intakes 421 and 422 are formed at the bottom corner of the casing 40. A blower 43 to exhaust air from the casing 40 is installed at the exhaust port 41 and the air taken from the air intakes 421 and 422 is sent to and exhausted from the exhaust port 41 through the liberating heat exchangers 21 and 22 of the dehumidifying apparatus 20.

DC current is supplied to the dehumidifying apparatus 20 from the power circuit 44 stored in the casing 40.

Therefore, air is cooled by the absorbing heat exchanger 21, heated by the liberating heat exchanger 22, and sent to the exhaust port 41. A drain port 45 is formed at the bottom of the casing 40, which drains the water condensed by the electronic refrigerating unit including the absorbing heat exchanger 21 of the dehumidifying apparatus 20.

For the dehumidifying apparatus 20 with the above structure, portions with the lowest temperature of the heat absorbing fins 211, 212, ... of the absorbing heat exchanger 21, that is, electrodes 231, 232, ... enclosed by N-type thermoelectric elements 271, 272, ... and P-type thermoelectric elements 281, 282, ... and heat liberating fins 221, 222, ... of the liberating heat exchanger 22 are installed in the air channel, and portions with the highest temperature, that is, electrodes 241, 242, ... enclosed by P-type thermoelectric elements 222, 223, ... and N-type thermoelectric elements 211, 222, ... are also installed in the air channel. Therefore, it is possible to greatly improve the water-condensing characteristic of the absorbing heat exchanger 21 and the heat-releasing characteristic of the liberating heat exchanger 22. That is, because the air efficiently cooled by the absorbing heat exchanger 21 is sent to the liberating heat exchanger 22 where the temperature is maximized, it is possible to decrease the temperature difference $\Delta T$ ($=T_H-T_C$) between the temperature $T_H$ of the hot portion of the liberating heat exchanger 22 and the temperature $T_C$ of the cold portion of the absorbing heat exchanger 21, which greatly influences the efficiency of the thermoelectric conversion unit.

Figure 8:
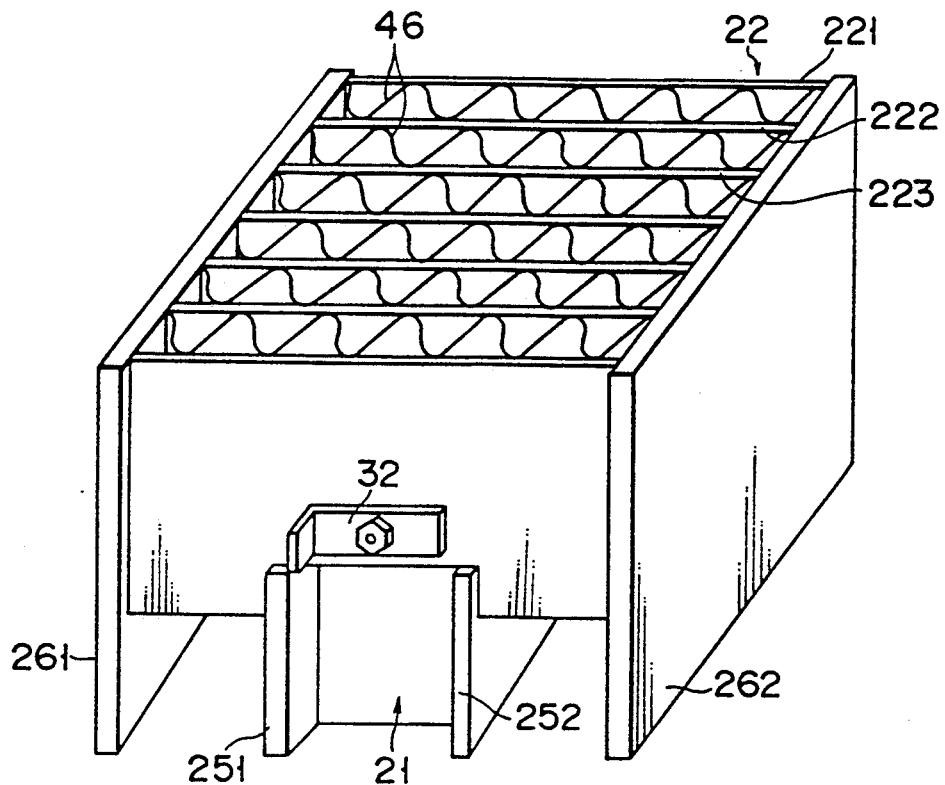
FIG. 8 shows a perspective view of the second embodiment of the present invention.

FIG. 8 shows the second embodiment for further improving the heat exchange efficiency. For this embodiment, a corrugated fin 46 is installed between heat liberating fins 221, 222, ... constituting an liberating heat exchanger 22 and between heat absorbing fins 211, 212, ... (not illustrated) constituting an absorbing heat exchanger 21. Thus, the absorbing and liberating areas are greatly increased and the dehumidifying capacity is further improved.

Figure 9:
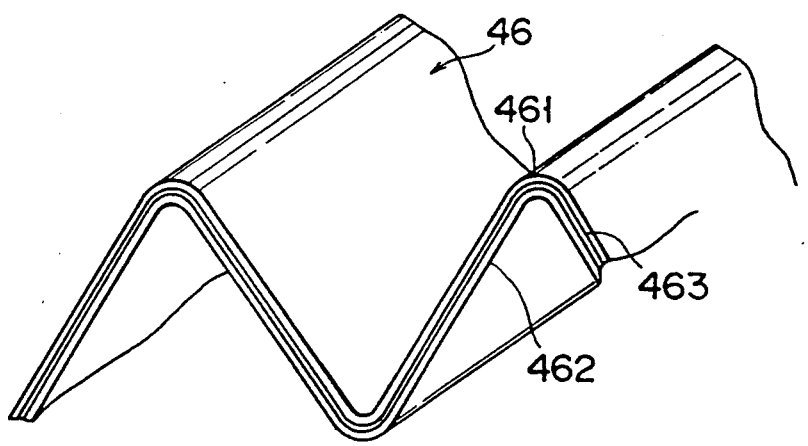
FIG. 9 shows an enlarged view of a part of the corrugated fin used for the embodiment in FIG. 8.

In this case, because adjacent heat absorbing fins 211, 212, ... and heat liberating fins 221, 222, ... are not electrically shorted, the corrugated fin 46 is formed with a corrugated plate made by sandwiching an electrically-insulating resin layer 463 between the metallic plates 461 and 462 as shown in FIG. 9.

For the dehumidifying apparatus 20 with the above structure, it is assumed as shown in FIG. 10 that the entire height is L and the length of heat liberating fins 221, 222, ... is Lh ($Lh_1 + Lh_2$). When air flow is generated from the bottom of FIG. 10 by a blower (not illustrated), the air passing through the channels A1 and A2 and the central channel B is distributed by the air resistance at the heat exchanger.

The air flow Wac through the channel B is shown by the following expression when the entire air flow is assumed as Wa.

$$Wac = \frac{DC\sqrt{Lh_1 + Lh_2}}{(Ch\sqrt{L} + DC\sqrt{Lh_1 + Lh_2})} \cdot Wa$$

The air flow Wah through the channels A1 and A2 is shown by the following expression.

$$Wah = \frac{Dh\sqrt{L}}{(Dh\sqrt{L} + DC\sqrt{Lh_1 + Lh_2})} \cdot Wa$$

Thus, shape parameters (Dc, Dh, L, Lh$_1$, and Lh$_2$) to realize the air flow distribution for the most-efficient dehumidification are determined to obtain the shape of the absorbing heat exchanger 21 (heat absorbing fins 211, 212, ...) and liberating heat exchanger 22 (heat liberating fins 221, 222, ...).

For example, when Dc is assumed as 35 mm, Dh as 27 mm, L as 90 mm, Lh$_1$ as 22 mm, and the air flow rate was as 30 m$^3$/h, it is suitable to set the length Lh$^2$ to 16 mm which maximizes the moisture removing efficiency as shown in FIG. 11.

Figure 12A:
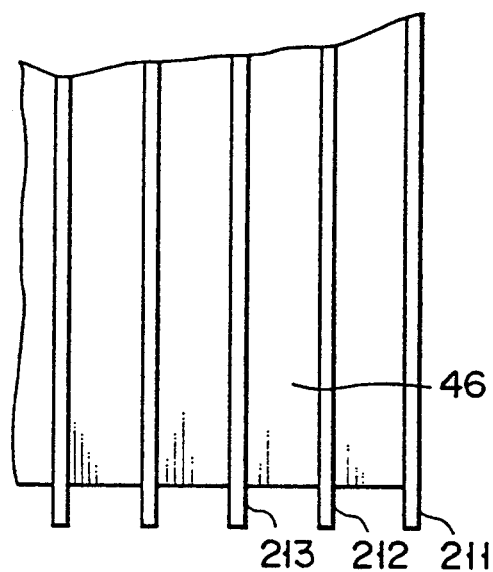
FIGS. 12A and 12B are schematics showing the lengths of the endothermic fin and corrugated fin.
Figure 12B:
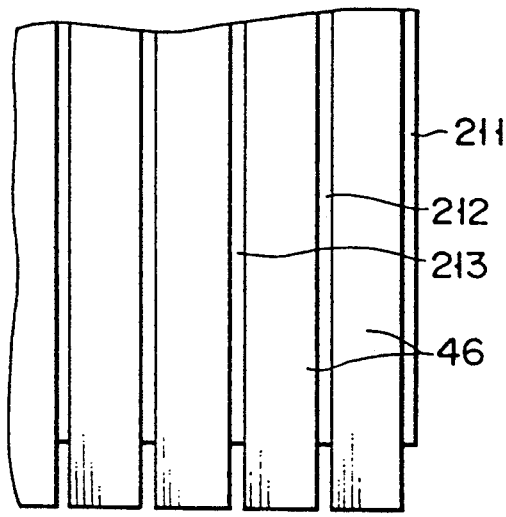

In this case, to avoid the dehumidification effect from being impaired due to the condensed water which is attached to the heat absorbing fins 211, 212, ... and the corrugated fin 46 and remains at the bottom of the heat absorbing fins 211, 212, ..., it is necessary to extend the bottom end of the heat absorbing fins 211, 212, ... beyond that of the corrugated fin 46 as show in FIG. 12A, or, on the contrary, to protrude the corrugated fin 46 downward as shown in FIG. 12B.

In addition, to smoothly drip the condensed water, it is effective to form annular protrusions 21a and 21b at the both bottom margins of the heat absorbing fin 211 so that drips are concentrated, as shown in FIG. 13A. It is also effective to tilt the bottom end of the fin 211 as shown in FIG. 13B or to form a protrusion 21c at the bottom center of the fin 211 as shown in FIG. 13C.

Figure 14:
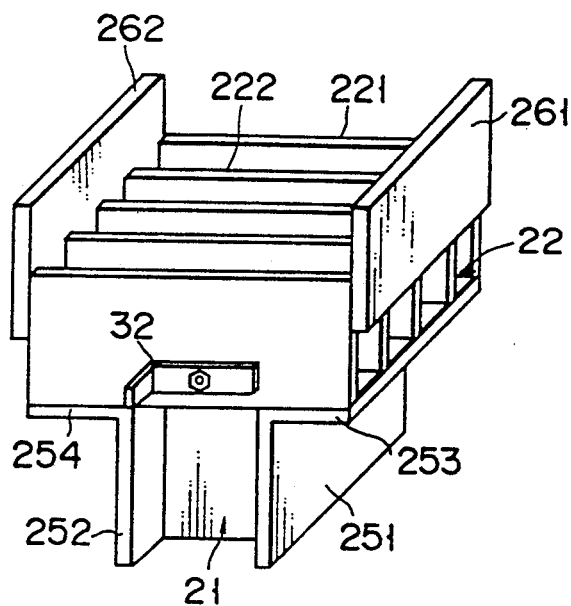
FIG. 14 shows the third embodiment of the present invention.

For the above embodiments, the air not passing through the absorbing heat exchanger 21 is supplied to the liberating heat exchanger 22 from the outside of the side plates 251 and 252. However, as the embodiment in FIG. 14 shows, it is possible to form extension plates 253 and 254 so that they cover the air intake and the bottom surface of the liberating heat exchanger 22 together with the side plates 251 and 252 partitioning the absorbing heat exchanger 21 and locally open the bottom side of the liberating heat exchanger 22 by shortening the side plates 261 and 262.

Figure 15:
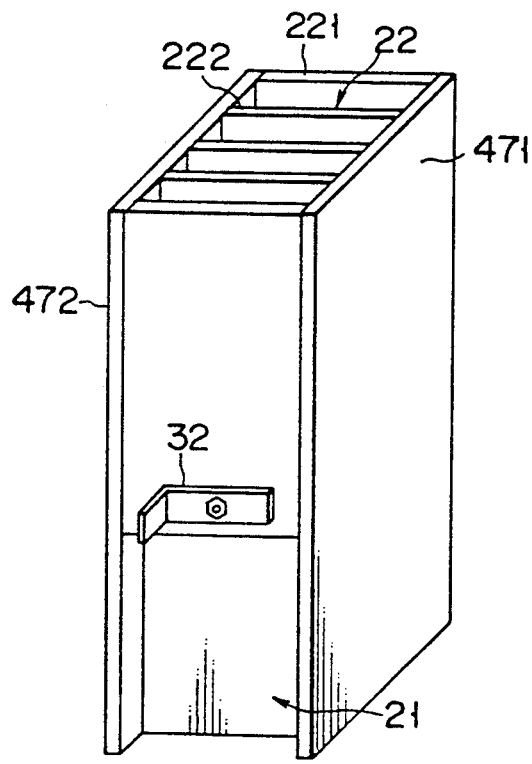
FIG. 15 shows the fourth embodiment of the present invention.

As the embodiment in FIG. 15 shows, it is also possible to form the heat absorbing fins constituting the absorbing heat exchanger 21 and the heat liberating fins constituting the liberating heat exchanger 22 with the same width and installing side plates 471 and 472 so that they are common to the heat exchangers 21 and 22 and only one air channel is required. For the above structure, however, it is difficult to increase the air flow. Therefore, it is necessary to increase, for example, the length of the longitudinal direction and the area of the heat liberating fins 221, 222, ... constituting the liberating heat exchanger 22 so that the heat releasing characteristic is improved.

For the above embodiments, N-type and P-type thermoelectric elements are assembled with electrodes by a bolt. However, it is possible to assemble side plates forming an air channel and use them for strength members so that the required mechanical strength can be obtained by optional structure. For the above embodiments, an air channel is formed by using side plates and air flow is generated in the air channel by a blower. However, because air is cooled by an absorbing heat exchanger and heated by a liberating heat exchanger, it is also possible to circulate dehumidified air by using the convection generated due to the temperature difference of the heat-exchanged air.

Figure 16:
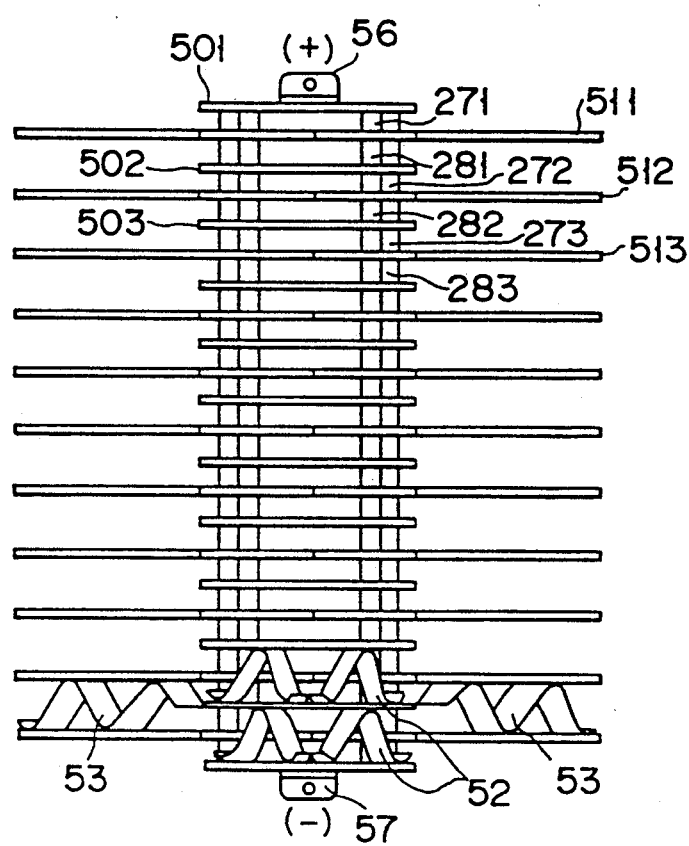
FIG. 16 shows a top view of the block diagram of the fifth embodiment of the present invention.

FIGS. 16 and 17 show the fifth embodiment of the dehumidifying apparatus. The thermoelectric conversion unit of this embodiment consists of a plurality of isosceles triangular heat liberating fins 501, 502, ... and a plurality of heat liberating fins 511, 512, ... having triangular notches to which the heat absorbing fins 501, 502, ... can be fitted one each. These fins are made of aluminum, which are overlapped each other. N-type thermoelectric elements 271, 272, ... and P-type thermoelectric elements 281, 282, ... are alternately installed between the fins. Each thermoelectric element and fin are connected by solder.

In this case, as shown in FIG. 17, the heat absorbing fins 501, 502, ... are installed so that each of them is fitted to the triangular notch formed on each of the heat absorbing fins 511, 512, ... and the heat liberating fins 511, 512, ... are formed so that the both ends of them extend beyond the heat absorbing fins 501, 502, ... The corrugated fin 52 is installed between the heat absorbing fins 501, 502, ... and the corrugated fin 53 is installed between the heat liberating fins 511, 512, ... The corrugated fins and the heat absorbing and heat liberating fins are connected by solder.

FIG. 18 shows a part of the corrugated fin 52 (53) used for this embodiment, which is composed of a three-layer plate made by putting a thin resin plate 521 between aluminum foils 522 and 523. The three-layer plate is formed by corrugating a strip member so that its ridge is tilted in the longitudinal direction. The ridge is soldered with an heat absorbing or heat liberating fin.

Figure 19:
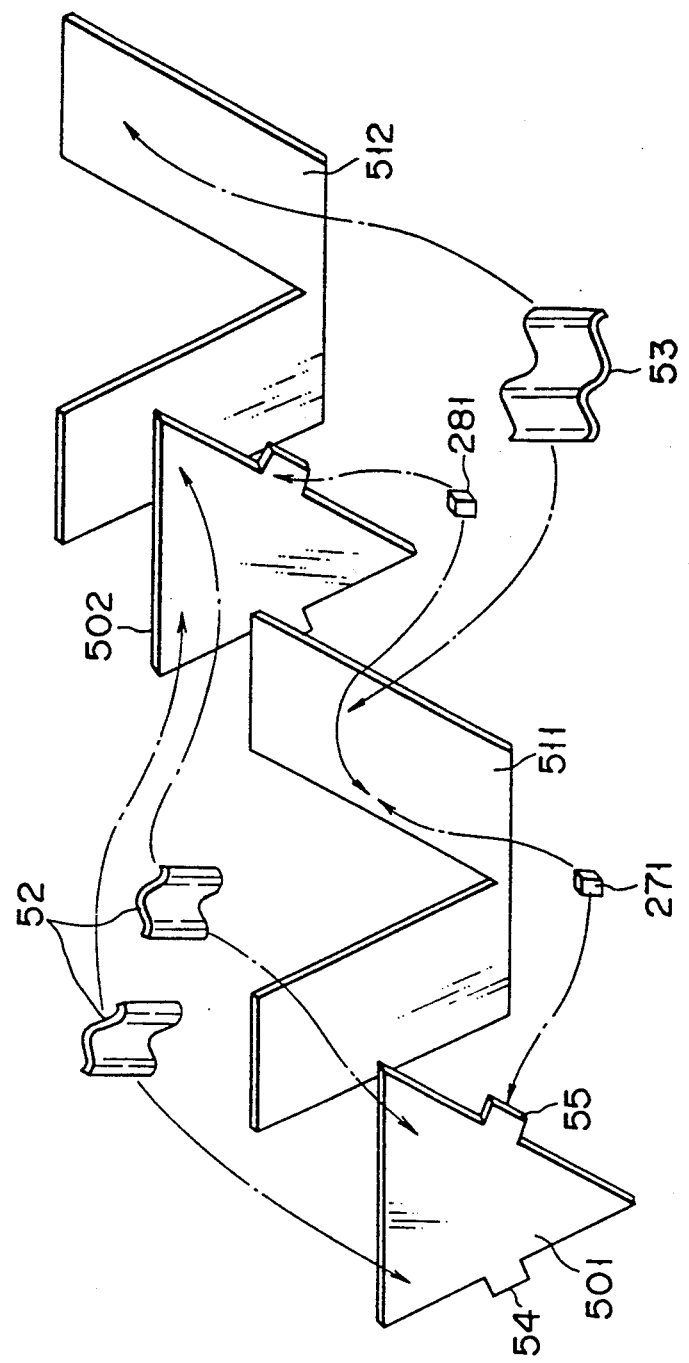
FIG. 19 shows an exploded view of the fin of the fifth embodiment.

FIG. 19 shows an exploded view of the dehumidifying apparatus, in which protrusions 54 and 55 are formed at the two sides of each of the triangular fins 501, 502, ... corresponding to the notch of each of the heat liberating fins 511, 512, ..., and N-type thermoelectric elements 271, 272, ... or P-type thermoelectric elements 281, 282, ... are set between the protrusions 54 and 55 and two sides of the notch of each of heat liberating fins 511, 512, .... For this embodiment, every two thermoelectric elements are arranged in parallel, N-type thermoelectric elements 271, 272, ... and P-type thermoelectric elements 511, 512, ... are connected in series by putting the heat absorbing fins 501 502, ... and heat liberating fins 511, 512, ... between them as electrodes respectively, and the electrode terminals 56 and 57 are installed on the heat absorbing fins 501 and 50n installed at the both ends of the above series circuit. And, a DC power source (not illustrated) is connected between the electrode terminals 56 and 57. In this case, a positive power source is connected to the electrode terminal 56 and a negative power source is connected to the electrode terminal 57.

The termoelectric conversion unit is thus formed. When the DC power source is connected with the electrode terminal 56 and 57, DC current flows from the heat absorbing fin 501 to decrease the temperature of the portions of the heat absorbing fins 501, 502, ... constituting NP junction connected to thermoelectric elements and increase that of the portions of the portions of the heat liberating fins 511, 512, ... constituting PN junction connected to thermoelectric elements.

Then, heat is exchanged with the contacted air at the absorbing heat exchanger consisting of the heat absorbing fins 501, 502, ... and the liberating heat exchanger consisting of the heat liberating fins 511, 512, ....

Figure 20:
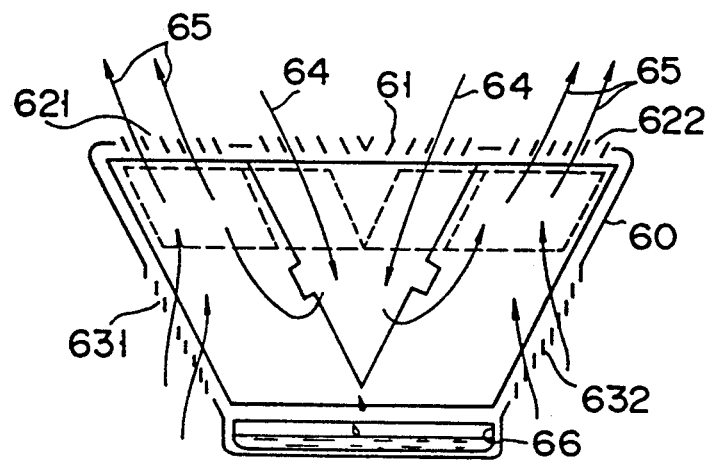
FIG. 20 shows a schematic for explaining the flow of dehumidified air in the fifth embodiment.

FIG. 20 shows a dehumidifying apparatus consisting of the thermoelectric conversion unit with the above structure, in which the portion enclosed by the two equal-length sides of the heat absorbing fins 501, 502, ... is set in a case 60 so that it is brought to the upper side. The case 60 faces the side portion set above the air channel 61 opening at the side portion set above the heat absorbing fins 501, 502, ... and the side portion set above the heat liberating fins 511, 512, ..., and has the air channels 621 and 622 formed at the both sides of the channel 61 and the air channels 631 and 632 respectively opening at the bottom side of the heat liberating fins 511, 512, ....

For the above dehumidifying apparatus, when the specified power source is connected to the thermoelectric conversion unit, the temperature of the heat absorbing fins 501, 502, ... decreases to cool the air contacting the fins. The cooled air becomes heavier than the ambient air and flow downward through the air channel 61 as shown by arrows 64. Meanwhile, the air contacted with the heat liberating fins 511, 512, ... is heated, flows upward, and is exhausted from the air channels 621 and 622. That is, the air flow shown by arrows is naturally generated by heat exchange due to heat absorbing and heat liberating reactions. In this case, external air is taken to the heat liberating fins 511, 512, ... from the air channels 631 and 632 so that the heat liberating effect of the heat liberating fins 511, 512, ... is improved.

That is, the air contacted with the heat absorbing fins 501, 502, ... is cooled and condensed to remove water from the air for dehumidification.

The dehumidified air is exhausted to the outside through the heat liberating fins 511, 512, ... from the air channels 621 and 622. Meanwhile the water condensed by the heat liberating fins 501, 502, ... drops from the bottom end of the heat absorbing fins 501, 502, etc into a pan 66.

For the dehumidifying apparatus with the above structure, air naturally flows closely to the thermoelectric element of the heat absorbing section. Therefore, dehumidified air circulates without producing air flow noises. The corrugated fins 52 and 53 are formed by corrugating a strip member so that its ridge is diagonally set. Therefore, it is possible to set the air flow in the conventional direction by setting the ridge correspondingly to the air flow direction. Thus, heat exchange due to heat absorbing and heat liberating reactions is efficiently executed and the direction of dehumidified air is effectively rectified.

Figure 21:
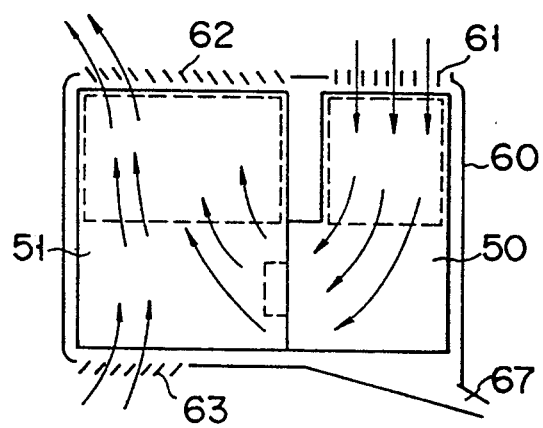
FIG. 21 shows the sixth embodiment of the present invention.

FIG. 21 shows the sixth embodiment which is made by further modifying the fin structure, in which a heat absorbing fin 50 and heat liberating fin 51 are protruded from the both sides. For this structure, downward air is taken to the heat absorbing fin 50 from the air channel 61 of the case 60 and it flows toward the heat liberating fin 51.

Then, the upward air heated by the heat liberating fin 51 is exhausted from the air channel 62. External air is also taken to the heat liberating fin 51 from the air channel 63. The water condensed by the heat absorbing fin 50 is discharged to the outside from a drain pipe 67.

Figure 22A:
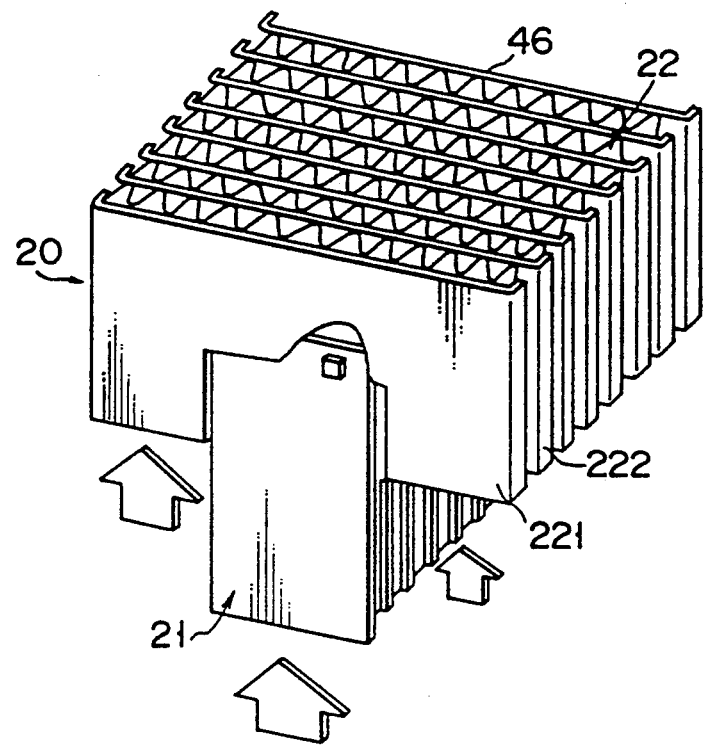
FIG. 22A shows a perspective view of the seventh embodiment of the present invention.
Figure 22B:
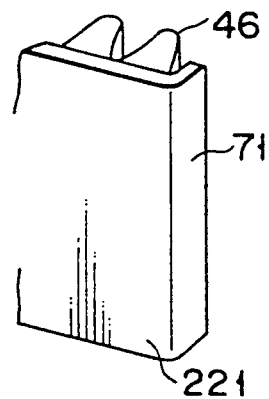
FIG. 22B shows an enlarged view of a part of the fin of the dehumidifying apparatus related to the seventh embodiment.

The seventh embodiment shown in FIGS. 22A and 22B is formed, for example, by folding the both sides of the heat liberating fins 221, 222, ... constituting the heat exchanger 22. FIG. 22B shows the fin 221 in which an edge 71 is formed by folding the end of the fin. By forming the folded edge 71, the mechanical folding strength of the heat liberating fins 221, 222, ... is increased, the transverse displacement of the corrugated fin 46 is prevented, adequate strength reliability of the heat exchanger 22 is obtained.

Figure 23:
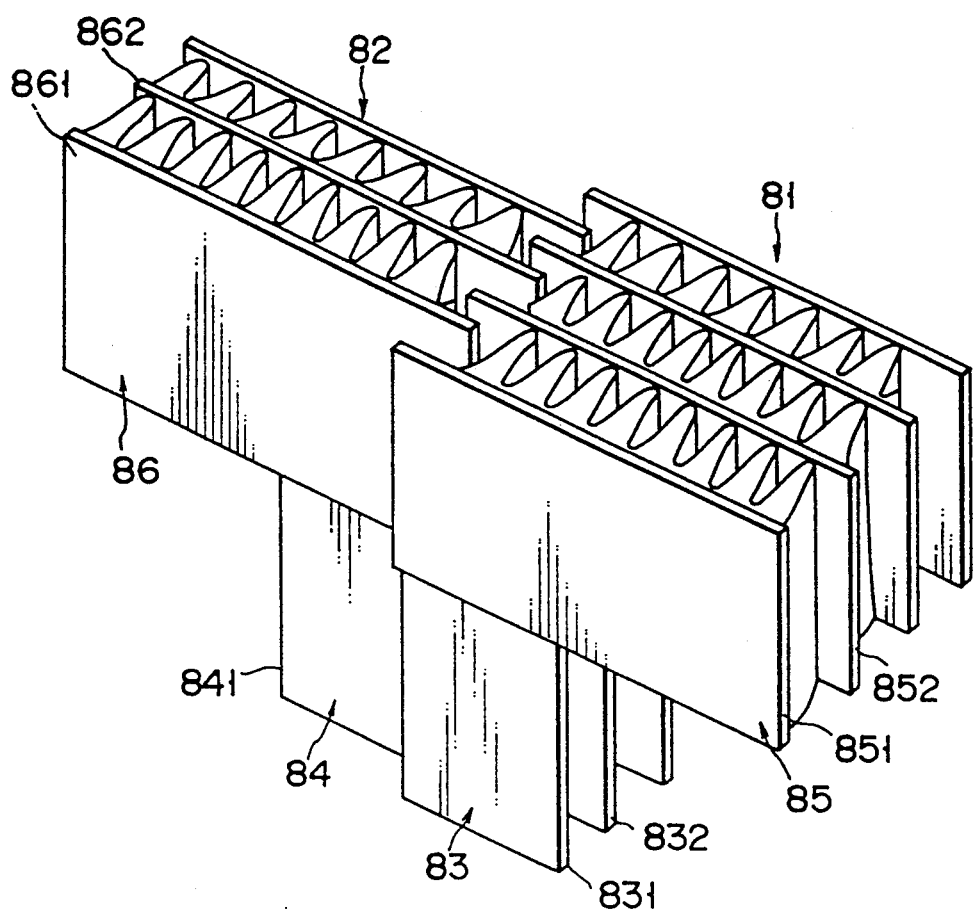
FIG. 23 shows a perspective view of the eighth embodiment of the present invention.

FIG. 23 shows the eighth embodiment, in which one dehumidifying apparatus is composed of two groups of dehumidification systems 81 and 82. The dehumidification system 81 is composed of an absorbing heat exchanger 83 and a liberating heat exchanger 85 and the dehumidification system 82 is composed of an absorbing heat exchanger 84 and a liberating heat exchanger 86.

In this case, the absorbing heat exchangers 83 and 84 consisting of heat absorbing fins 831, 832, ... and 841, 842, ... respectively are installed in parallel and combined to set heat liberating fins 851, 852, ... and 861, 862, ... constituting the liberating heat exchangers 85 and 86 respectively.

The heat liberating fins 851, 852, ... and 861, 862, ... are installed at the both sides of the absorbing heat exchangers 83 and 84 so that they expand like a wing. For this structure, the air cooling surface and heat releasing surface are horizontally expanded. Therefore, the height of the dehumidifying apparatus can easily be decreased.

For the above embodiments, the heat absorbing fin constituting the embodiments, heat exchanger and the heat liberating fin constituting the liberating heat exchanger are alternately and regularly arranged. However, it is possible to ignore the regularity to decrease the number of manufacturing and assembling processes or it is possible to disuse some heat exchangers.

Figure 24:
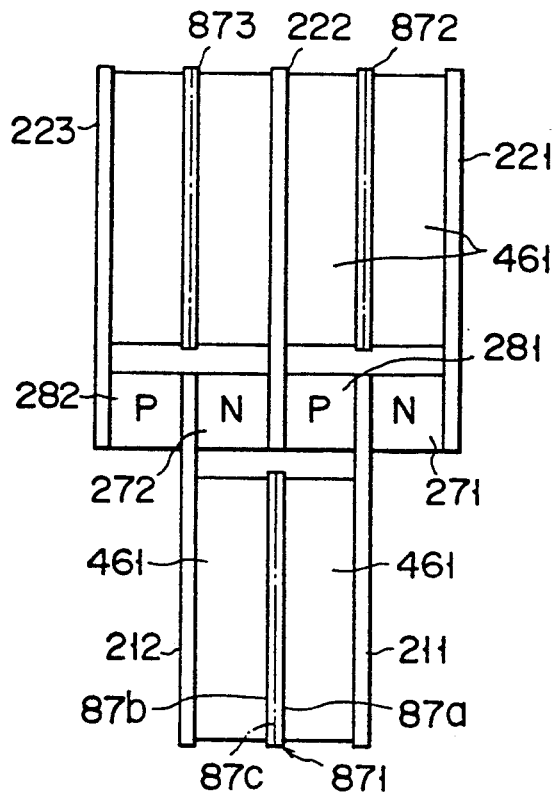
FIG. 24 shows a side view of the ninth embodiment of the present invention.

FIG. 24 shows the ninth embodiment made by improving the structure of the corrugated fin 46 of the second embodiment shown in FIG. 8, in which plates 871, 872, ... are respectively set between heat absorbing fins 211, 212, ... and between heat liberating fins 871, 872, ... and the corrugated fin 46 is put between the both surfaces of each of the plates 871, 872, ... and heat absorbing and heat liberating fins.

In this case, each corrugated fin 461 is made of a conductive metal, while the plates 871, 872, ... are formed by sandwiching an insulating layer 87c between metallic plates 87a and 87b so that the heat absorbing fins 211, 212, ... and the heat liberating fins 221, 222, ... are insulated from each other.

Figure 25:
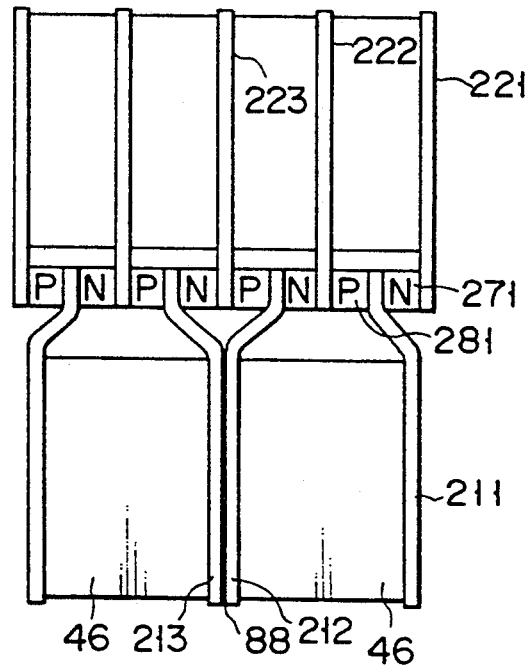
FIG. 25 shows a side view of the tenth embodiment of the present invention.

FIG. 25 shows the tenth embodiment made by improving the water repelling characteristic of heat absorbing fins 211, 212, ..., in which the heat absorbing fins 211, 212, ... are bonded every adjacent fins by an insulating adhesive 88 so that adjacent ones are insulated.

For the above structure, the corrugated fin 46 set to the heat absorbing fins 211, 212, ... is provided with the height two times larger than that of the embodiment shown in FIG. 8 and the water remaining at the heat absorbing fins 211, 212, ... is more effectively repelled. For the first embodiment shown in FIG. 1, the heat absorbing fins 211, 212, ... and the heat liberating fins 221, 222, ... are formed so that the electrode section is formed, at the center, of each fin as shown in FIG. 2. FIGS. 26A through 26C shows the eleventh embodiment made by improving the first embodiment. As shown in FIG. 26A, quadrangular protrusions 22e and 22f are formed inward at the both top corners of the notch 22a of the heat liberating fin 221 (222, ... ). Also as shown in FIG. 26B, protrusions 21b and 21c are formed upward at the both top corners of the heat absorbing fin 211 (212, ... ) so that they are overlapped with the protrusions 22e and 22f respectively. Then, as shown in FIG. 26C, the heat absorbing fin 211 is assembled with the heat liberating fin 221 so that the protrusions 21b and 21c of the heat absorbing fin 211 are overlapped with the protrusions 22e and 22f of the heat liberating fin 221, and N-type and P-type thermoelectric elements are secured at the overlapped portion.

For the above structure, the overlapped portion between each of the heat absorbing fins 211, 212, . . . and each of the heat liberating fins 221, 222, . . . decreases and therefore, heat exchange with the air passing through the portion is efficiently executed.

FIGS. 27A through 26C shows the twelfth embodiment which has a structure for more easily increasing the strength instead of the structure in which a heat absorbing fin and heat liberating fin are alternately laminated and a thermoelectric element is put between the fins. That is, a pair of heat absorbing fins 211 and 212 are installed by sandwiching a corrugated fin 462 so that they are faced each other and heat liberating fins 221 and 222 are arranged so that they are located above and outside the heat absorbing fins 211 and 212. The heat liberating fins 221 and 222 are also integrated by a corrugated fin 463.

The heat absorbing fins 211 and 212 and heat liberating fins 221 and 222 are set so that the top end of each heat absorbing fin is partially overlapped with the bottom end of each heat liberating fin and N-type thermoelectric elements 271, 272, . . . and P-type thermoelectric elements 281, 282, . . . are put between each of the heat absorbing fins 221 and 222 and each of the heat liberating fins 221 and 222 which face the overlapped portion.

In this case, the heat absorbing fins 211 and 222, as shown in FIG. 27C, are respectively divided into a plurality of pieces every two thermoelectric elements, and the heat liberating fins 221 and 222 are also divided into a plurality of pieces every two thermoelectric elements as shown in FIG. 27B. Then, N-type thermoelectric elements 271, 272, . . . and P-type thermoelectric elements 281, 282, . . . are alternately connected in series. A power source is connected between the heat liberating fins 221 and 222 and the heat absorbing fins 211 and 212.

Meanwhile, the corrugated fin 462 is divided every divided unit of the heat absorbing fins 211 and 212 and the corrugated fin 463 is also divided every divided unit of the heat liberating fins 221 and 222. Corrugated fins 4621 and 4622 are installed at the outside of each of the heat absorbing fins 211 and 212 and corrugated fins 4631 and 4632 are also installed at the outside of each of the heat liberating fins 221 and 222 so that the heat exchange performance of each fin is further improved.

Figure 28A:
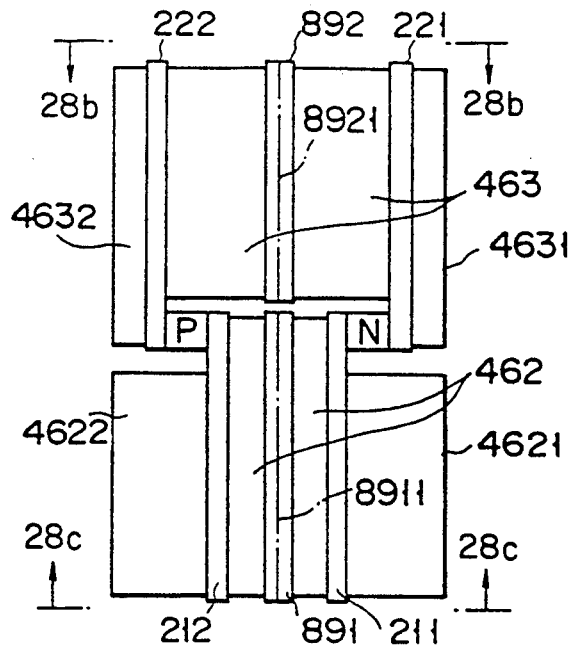
FIG. 28A shows a front view of the thirteenth embodiment of the present invention.
Figure 28B:
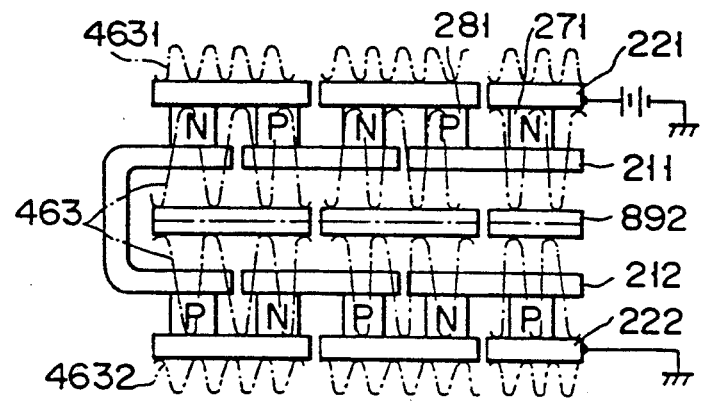
FIGS. 28B and 28C show schematics viewed from the lines 28b—28b and 28c—28c in FIG. 28C.
Figure 28C:
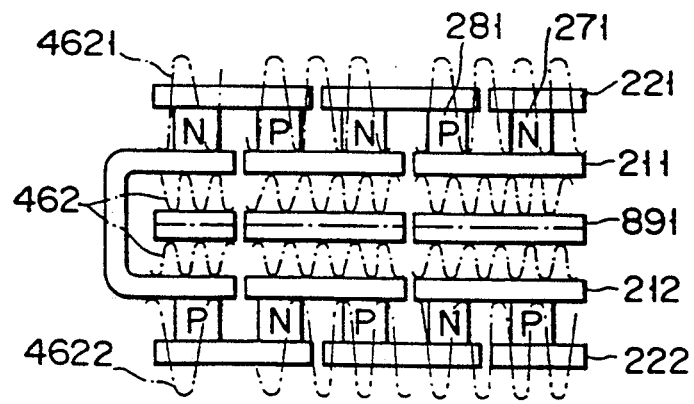

FIGS. 28A through 28C show the thirteenth embodiment. For this embodiment, plates 891 and 892 are set between the heat absorbing fins 211 and 212 and between the heat liberating fins 221 and 222 one each. The corrugated fins 462 and 463 are divided into two pieces by the plates 891 and 892 respectively. A power source is connected between the heat liberating fins 221 and 222, the heat absorbing fins 211 and 212 are electrically connected with each other at their one end, and N-type and P-type thermoelectric elements are successively connected in series which are arranged between the heat absorbing fin 211 and heat liberating fin 221 and between the heat absorbing fin 212 and heat liberating fin 222 respectively.

Therefore, for this embodiment, it is necessary to electrically insulate the heat absorbing fin 211 from 212 and the heat liberating fin 221 from 222. For this reason, each of the plates 891 and 892 is made by sandwiching an insulating layer.

FIGS. 29A through 29C show the fourteenth embodiment which has a pair of legs which are arranged in parallel, a plurality of heat absorbing fin units 901, 902, . . . made by forming a metallic plate into a U shape so that the legs are connected by a connecting piece, and a plurality of heat liberating fin unit 911, 912, . . . having the same structure as the heat absorbing fin unit. The heat absorbing fin units 901, 902, . . . and the heat liberating fin units 911, 912, . . . are arranged by connecting their legs to form an absorbing heat exchanger 90 and liberating heat exchanger 91. In this case, the heat absorbing fin units 901, 902, . . . and heat liberating fin units 911, 912, . . . are bonded by the insulating adhesives 921, 922, . . . so that they are electrically insulated each other.

The liberating heat exchanger 91 is set above the absorbing heat exchanger 90 with the above structure so that the both legs of the heat absorbing fin units 901, 902, . . . are respectively brought to the center line between the both legs of the heat liberating fin units 911, 912, . . . . The both legs of the heat liberating fins 901, 902, . . . constituting the heat exchanger 90 and those of the heat liberating fins 911, 912, . . . constituting the heat exchanger 91 are respectively connected by the corrugated fin 93, and an air channel is formed in the direction where the heat exchanger 90 is set above the heat exchanger 91.

An electrode 94 extending toward the back of the connecting piece of each of the heat absorbing fin units 901, 902, . . . is installed on the connecting piece which connects the both legs of each of the heat liberating fin units 911, 912, . . . , and N-type thermoelectric elements 271, 272, . . . and P-type thermoelectric elements 281, 282, . . . are put between the electrode 94 and the connecting piece of the heat absorbing fin units 901, 902, . . . and connected b solder.

In this case, because the heat absorbing fin units 901, 902, . . . are respectively shifted from the heat liberating fin units 911, 912, . . . as described above, N-type thermoelectric elements 271, 272, . . . and the P-type thermoelectric elements 281, 282, . . . are alternately arranged and successively connected in series as shown in FIG. 29B.

For the dehumidifying apparatus with the above structure, the absorbing heat exchanger 90 consisting of the heat absorbing fin units 901, 902, . . . which are respectively independently structured is integrated with the heat liberating heat exchanger 91 consisting of the heat liberating fin units 911, 912, . . . which are respectively independently structure. Therefore, the entire assembly strength is easily improved.

Figure 30:
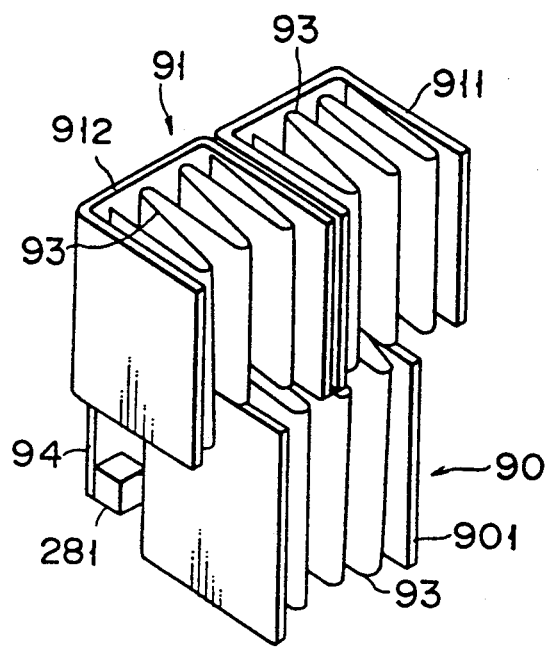
FIGS. 30 and 31 show other modifications of the fourteenth embodiment.
Figure 31:
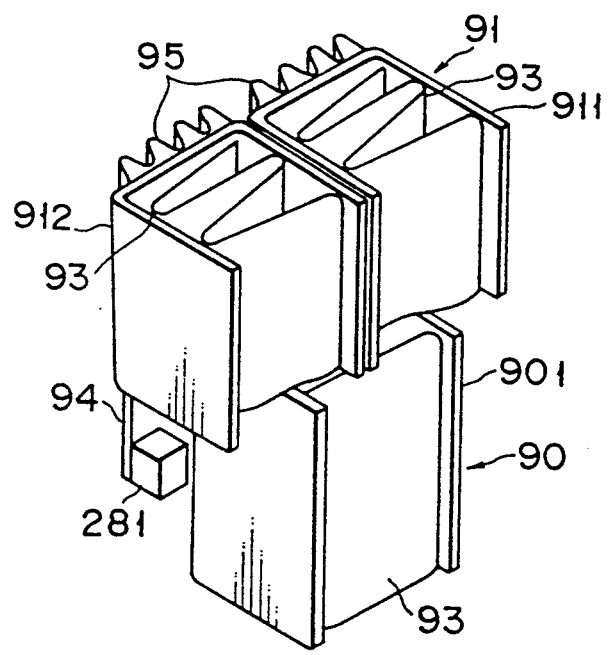

For this embodiment, an air channel may be formed in the direction from the absorbing heat exchanger 90 to the liberating heat exchanger 91 on the corrugated fin 93 constituting each fin unit. Therefore, as shown in FIG. 30, the corrugated fin 93 shown in the fourteenth embodiment can be set by changing its angle by 90°. Also, as shown in FIG. 31, it is possible to install different corrugated fin 95 on the back of the connecting piece of each of the heat absorbing fin units 901, 902, . . . and the heat liberating fin units 911, 912, . . . .

For the above embodiment, N-type and P-type thermoelectric elements are set between the electrode formed by extending it to the connecting piece of each of the heat liberating fin units 911, 912, . . . and the back of the connecting piece of each of the heat absorbing fin units 901, 902, . . . . However, as shown in FIGS. 32A through 32C, it is also possible to set the thermoelectric element 281 between the electrodes 941 and 942 by forming the electrode 941 on the connecting piece of each of the heat absorbing fin units 901, 902, . . . toward the heat liberating heat exchanger 91 and the element 942 on the connecting piece of each of the heat liberating fin units 911, 912, . . . In this case, the electrodes 941 and 942 are properly folded so that they face each other and the thermoelectric element is held by the facing electrodes.

Figure 33:
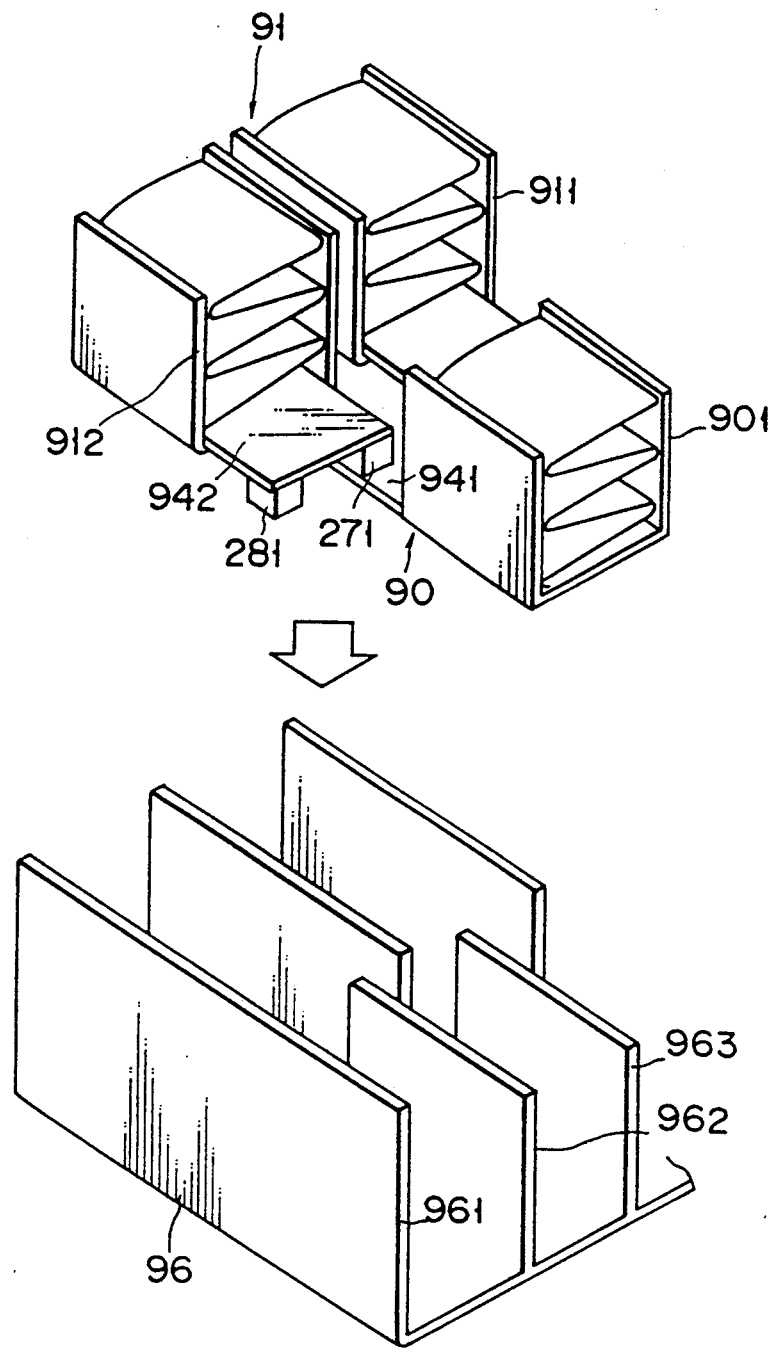
FIG. 33 shows an exploded view of the fifteenth embodiment of the present invention.
Figure 34:
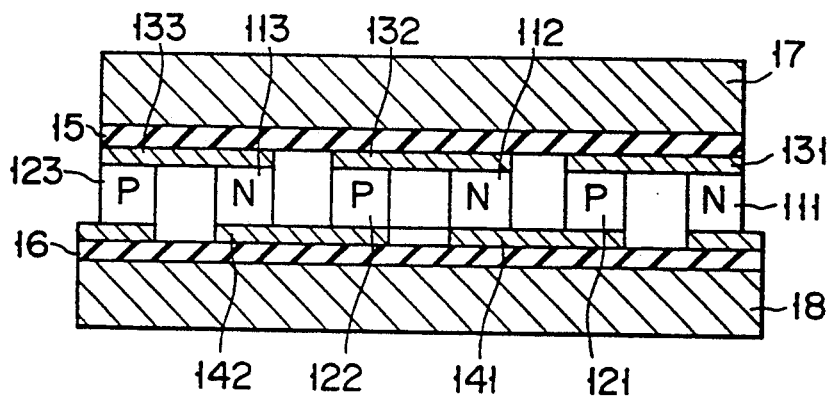
FIG. 34 shows a sectional block diagram for explaining the structure of a conventional thermoelectric conversion unit.

FIG. 33 shows the fifteenth embodiment in which a dehumidifying apparatus comprising the absorbing heat exchanger 90 consisting of the heat absorbing fin units 901, 902, . . . and the liberating heat exchanger 91 consisting of the heat liberating fin units 911, 912, . . . shown in the preceding embodiment is housed in the case 96 made of synthetic resin without bonding the heat absorbing fin units 901, 902, . . . and the heat liberating fin units 911, 912, . . . with the insulating adhesive.

The case 96 has partitions 961, 962, . . . for partitioning the heat absorbing fin units 901, 902, . . . and the heat liberating fin units 911, 912, . . . which are respectively housed in the area partitioned by each of the partitions 961, 962, . . . That is, each unit constituting the dehumidifying apparatus is insulated and held by the resin case 96.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A dehumidifying apparatus with an electronic refrigeration unit comprising:

a thermoelectric unit including a plurality of N-type thermoelectric elements, heat absorbing electrodes, P-type thermoelectric elements, and heat liberating electrodes electrically connected in series;

a DC power source for supplying DC current to said N-type and P-type thermoelectric elements serially connected through said heat absorbing and heat liberating electrodes so that a temperature of the heat absorbing electrode for supplying current from the N-type to P-type thermoelectric elements is decreased and a temperature of the heat liberating electrode for supplying current from the N-type to P-type thermoelectric elements is increased;

an absorbing heat exchanger integrated with the heat absorbing electrodes which constitutes said thermoelectric conversion unit and whose temperature is decreased so that heat can be transmitted, said heat absorbing exchanger including a plurality of heat absorbing fins;

a liberating heat exchanger integrated with the heat liberating electrodes so that heat can be transmitted, a heat liberating surface of said liberating heat exchanger being formed at a position different from said absorbing heat exchanger, said liberating heat exchanger including a plurality of heat liberating fins;

an air channel formed so that the air passing through said absorbing heat exchanger is exhausted through said liberating heat exchanger; and wherein a notch is formed in one side of each of said heat liberating fins so that a part of said heat absorbing fin fits the notch, said heat absorbing fins are set in a position corresponding to the notch of a corresponding heat liberating fin so that a part of the heat liberating fin overlaps with a part of said heat absorbing fin, and the overlapped portions of said heat absorbing fins and said heat liberating fins are used for used heat absorbing and heat liberating electrodes, respectively.

2. A dehumidifying apparatus according to claim 1, wherein said heat absorbing and liberating electrodes are arranged in parallel at a certain interval and N-type and P-type thermoelectric elements are set therebetween to form an electrical series circuit.

3. A dehumidifying apparatus according to claim 1, wherein said heat absorbing fins are made of a metallic plate with a heat conductivity, and said heat liberating fins are made of a metallic plate with a heat conductivity.

4. A dehumidifying apparatus according to claim 3, wherein said heat absorbing fins include flat metallic plates arranged in parallel at a certain interval, said heat liberating fins include metallic plates respectively set between said heat absorbing fins in parallel, said air channel is formed so that the air passing through said heat absorbing fins passes through said heat liberating fins, and a heat releasing area of said heat liberating fins is larger than the heat absorbing area of said heat absorbing fins.

5. A dehumidifying apparatus according to claim 1, wherein a pair of first side plates, arranged in parallel, are installed to hold the both sides of each of said heat absorbing fins and a pair of second side plates are installed to hold the both sides of each of said heat liberating fins, and thereby said air channel is formed to lead the air passing through the first side plates to the second side plates.

6. A dehumidifying apparatus according to claim 3, wherein said heat absorbing fins include rectangular metallic plates arranged in parallel at a certain interval, said heat liberating fins include rectangular metallic plates with the same width as said heat absorbing fins, each of said heat liberating fins is set between said heat liberating fins, and common side plates installed at both sides of the heat absorbing and heat liberating fins to form said air channel.

7. A dehumidifying apparatus according to claim 1, wherein said heat absorbing fins made of a metallic plate with a heat conductivity, said heat liberating fins made of a metallic palate with a heat conductivity, and a corrugated fin is set between said heat absorbing fins and between said heat liberating fins.

8. A dehumidifying apparatus according to claim 7, wherein said corrugated fin has a sandwich structure made by putting an insulating layer between two metallic plates with a heat conductivity and the heat absorbing fins and heat liberating fins are electrically insulated from each other.

9. A dehumidifying apparatus according to claim 7, wherein one of a bottom end of said heat absorbing fins and said corrugated fins arranged between the heat absorbing fins protrudes from the other.

10. A dehumidifying apparatus according to claim 7, wherein at least one protrusion is formed on a bottom end of said heat absorbing fins.

11. A dehumidifying apparatus according to claim 1, wherein said heat absorbing fins are each made of an isosceles triangular metallic plate with an apex of its bottom, said heat liberating fins are each made of a metallic plate and the notch formed therein is at its upper side and triangularly shaped so that a heat absorbing fin fits the notch, said heat absorbing fins are arranged in parallel at a certain interval, each of said heat liberating fins is set between said heat absorbing fins in parallel with the heat absorbing fins, said heat absorbing and heat liberating electrodes overlap each other and are formed on a side facing the isosceles side of each of said heat absorbing fins and each of said heat liberating fins, and N-type and P-type thermoelectric elements are set therebetween.

12. A dehumidifying apparatus according to claim 11, wherein:
a case is formed to enclose said combined heat absorbing and heat liberating fins; and
said air channel includes a first air channel formed on the case, which is located above said heat absorbing fins to take in air, and a second air channel formed on the case, which is located above said arranged heat liberating fins to exhaust dehumidified air in order to generate natural air convection so that the air taken from the first air channel is cooled and dehumidified by said heat absorbing fins and exhausted from the second air channel through said heat liberating fins.

13. A dehumidifying apparatus according to claim 1, wherein said heat absorbing fins and said heat liberating fins are each made of a metallic plate, said heat absorbing fins are arranged at a certain interval, said heat liberating fins are installed at a side of said heat absorbing fins and respectively set between the heat absorbing fins in parallel with them, said heat absorbing and heat liberating electrodes overlap each other and are formed at a side where each of said heat absorbing fins faces each of said heat liberating fins, and said N-type and P-type thermoelectric elements are set therebetween.

14. A dehumidifying apparatus according to claim 13, wherein
a case is formed to enclose said combined heat absorbing and heat liberating fins; and
said air channel includes a first air channel formed on the case, which is located above said arranged heat absorbing fins to take in air, and a second air channel formed on the case, which is located above said arranged heat liberating fins to exhaust dehumidified air.

15. A dehumidifying apparatus according to claim 1, wherein said heat absorbing fins are each made of a metallic plate with a heat conductivity, said heat liberating fins are each made of a metallic plate with a heat conductivity, a corrugated fin is set between said heat absorbing fins and between said heat liberating fins, each of the corrugated fins is divided into at least two pieces between the heat absorbing fins and between the heat liberating fins, and the divided pieces of each corrugated fin are connected by a plate made by sandwiching an insulating layer.

16. A dehumidifying apparatus according to claim 1, wherein said absorbing heat exchanger consists of a plurality of heat absorbing fins made of a metallic plate with a heat conductivity together with said heat absorbing electrodes, the heat absorbing fins are folded so that the both folded surfaces of the heat absorbing fin respectively contact adjacent one through an insulating layer.

17. A dehumidifying apparatus according to claim 16, wherein a corrugated fin is set between the surface opposite to the contacted surface and another heat absorbing fin facing the surface.

18. A dehumidifying apparatus according to claim 1, wherein each of a plurality of pairs of N-type and P-type thermoelectric elements are alternately arranged at a certain interval, said heat absorbing electrode is connected to a first surface of each N-type and P-type thermoelectric element, a plurality of pairs of P-type and N-type thermoelectric elements are alternately arranged, said heat liberating electrode is connected to a second surface, opposite said first surface, of each P-type and N-type thermoelectric element, said N-type and P-type thermoelectric elements are alternately connected in series by said heat absorbing and heat liberating electrodes.

19. A dehumidifying apparatus according to claim 18, wherein two units respectively consisting of said heat absorbing electrodes and said heat liberating electrodes arranged by sandwiching said arranged N-type and P-type thermoelectric elements, at a certain interval, so that the units face each other.

20. A dehumidifying apparatus according to claim 19, wherein said heat absorbing and heat liberating fins, respectively, extend in a direction opposite to each other, said absorbing and liberating heat exchanges are formed on said absorbing and liberating electrodes, respectively, a corrugated fin is set between any facing heat absorbing fins of said two units, and a corrugated fin is set between any facing heat liberating fins of said two units.

21. A dehumidifying apparatus according to claim 20, wherein an insulating plate is set between said faced heat absorbing fins and between said faced heat liberating fins, said corrugated fin is set between both surfaces of each plate and adjacent heat absorbing fins and between both surfaces of each plate and adjacent heat liberating fins.

22. A dehumidifying apparatus according to claim 18, wherein heat absorbing fins constituting said absorbing heat exchangers are formed by folding and extending them at the both sides of said pair of N-type and P-type thermoelectric elements of said heat absorbing electrodes in the direction perpendicular to the direction in which said thermoelectric elements are arranged, heat liberating fins constituting said liberating heat exchangers are formed by folding and extending them at the both sides of said pair of P-type and N-type thermoelectric elements of said heat liberating electrodes in the same direction as said heat absorbing fins, and a corrugated fin is set between the heat absorbing fins and between the heat liberating fins for said each pair.

23. A dehumidifying apparatus according to claim 22, wherein said adjacent pair of heat absorbing fins and that of heat liberating fins are bonded by an insulating adhesive.

24. A dehumidifying apparatus according to claim 22, further comprising:
a case made of an insulating resin, in which a plurality of heat absorbing fin units consisting of a heat liberating electrode and a pair of heat absorbing fins formed at the both sides of the electrode and a plurality of heat liberating fin units consisting of said heat liberating electrode and a pair of heat liberating fins formed at the both sides of the electrode are housed, having a plurality of partitions which are set between said heat absorbing fin units and between said heat liberating fin units.

* * * * *